United States Patent
Kim et al.

(10) Patent No.: US 11,839,129 B2
(45) Date of Patent: Dec. 5, 2023

(54) DISPLAY APPARATUS INCLUDING A LOW REFRACTIVE INDEX LAYER

(71) Applicant: Samsung Display Co., Ltd., Yongin-si (KR)

(72) Inventors: Younggu Kim, Yongin-si (KR); Jiyun Park, Yongin-si (KR); Bongsung Seo, Yongin-si (KR); Jongho Son, Yongin-si (KR); Jaejin Lyu, Yongin-si (KR); Yeonhee Lee, Yongin-si (KR); Baekkyun Jeon, Yongin-si (KR); Kyungseon Tak, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 303 days.

(21) Appl. No.: 17/224,002

(22) Filed: Apr. 6, 2021

(65) Prior Publication Data
US 2022/0052118 A1 Feb. 17, 2022

(30) Foreign Application Priority Data
Aug. 12, 2020 (KR) .................. 10-2020-0101399

(51) Int. Cl.
*H10K 59/38* (2023.01)
*H10K 59/12* (2023.01)

(52) U.S. Cl.
CPC ............. *H10K 59/38* (2023.02); *H10K 59/12* (2023.02)

(58) Field of Classification Search
CPC ........... H10K 50/854; H10K 2102/331; H10K 2101/80; H10K 59/38
See application file for complete search history.

(56) References Cited

U.S. PATENT DOCUMENTS

| 8,877,104 | B2 | 11/2014 | Iwata et al. | |
|---|---|---|---|---|
| 10,371,875 | B2 | 8/2019 | Kim et al. | |
| 2008/0311407 | A1* | 12/2008 | Kim | G02B 1/111 428/480 |
| 2015/0144900 | A1* | 5/2015 | Lee | C03C 17/002 257/40 |
| 2018/0081101 | A1* | 3/2018 | Kobori | G02B 5/305 |
| 2018/0156951 | A1* | 6/2018 | Baek | G02F 1/133514 |
| 2018/0305472 | A1* | 10/2018 | Kobori | C08K 5/11 |
| 2020/0081173 | A1* | 3/2020 | Tak | G02B 6/005 |
| 2020/0081292 | A1 | 3/2020 | Park et al. | |

FOREIGN PATENT DOCUMENTS

| JP | 5846243 B2 | 1/2016 |
|---|---|---|
| KR | 10-1202089 B1 | 11/2012 |
| KR | 10-1725585 B1 | 4/2017 |
| KR | 10-2020-0030147 A | 3/2020 |
| KR | 10-2020-0030156 A | 3/2020 |

* cited by examiner

*Primary Examiner* — Nduka E Ojeh
(74) *Attorney, Agent, or Firm* — Lewis Roca Rothgerber Christie LLP

(57) ABSTRACT

A display apparatus includes a first through a third light-emitting devices, each including a first-color emission layer and being over a substrate; a second-color quantum dot layer over the second light-emitting device; a third-color quantum dot layer over the third light-emitting device; and a low refractive index layer over the second-color quantum dot layer and the third-color quantum dot layer to correspond to the first through third light-emitting devices, and including a matrix part and a plurality of particles in the matrix part, wherein a first portion of the matrix part away from the first through third light-emitting devices includes fluorine.

10 Claims, 11 Drawing Sheets

DISPLAY APPARATUS INCLUDING A LOW REFRACTIVE INDEX LAYER

CROSS-REFERENCE TO RELATED APPLICATION

This application claims priority to and the benefit of Korean Patent Application No. 10-2020-0101399, filed on Aug. 12, 2020, the entire content of which is hereby incorporated by reference.

BACKGROUND

1. Field

One or more embodiments relate to a display apparatus, and more particularly, to a display apparatus having high luminous efficiency and a simplified structure.

2. Description of Related Art

A display apparatus includes a plurality of pixels. In the case of a full-color display apparatus, the plurality of pixels may emit light of different colors. To this end, at least some pixels of the display apparatus may include a color conversion unit. Accordingly, light of a first color generated by a light emitter of some pixels is converted into light of a second color while passing through a corresponding color conversion unit and is transmitted to the outside.

SUMMARY

A display apparatus according to the related art has a problem in that a structure thereof becomes complicated to improve the luminous efficiency.

An aspect of one or more embodiments of the present disclosure are directed towards a display apparatus having high luminous efficiency and a simplified structure. However, the disclosed embodiments and aspects are examples, and the present disclosure is not limited thereto.

Additional aspects will be set forth in part in the description which follows and, in part, will be apparent from the description, or may be learned by practice of the presented embodiments.

According to one or more embodiments, a display apparatus includes a substrate, a first light-emitting device, a second light-emitting device, and a third light-emitting device each including a first-color emission layer and being over the substrate, a second-color quantum dot layer over the second light-emitting device, a third-color quantum dot layer over the third light-emitting device, a low refractive index layer over the second-color quantum dot layer and the third-color quantum dot layer to correspond to the first through third light-emitting devices, and including a matrix part and a plurality of particles in the matrix part, wherein a first portion of the matrix part away from the first through third light-emitting devices includes fluorine, a first-color color filter layer over the low refractive index layer to correspond to the first light-emitting device, a second-color color filter layer over the low refractive index layer to correspond to the second light-emitting device, and a third-color color filter layer over the low refractive index layer to correspond to the third light-emitting device.

The display apparatus may further include a light-transmitting layer over the first light-emitting device, wherein the low refractive index layer is over the light-transmitting layer.

The first portion of the matrix part may be greater in fluorine content per unit volume than a second portion of the matrix part, the second portion being closer to the first through third light-emitting devices than the first portion of the matrix part is to the first through third light-emitting devices.

The first portion of the matrix part may be greater in fluorine content per unit volume than a second portion of the matrix part close to the first through third light-emitting devices.

The farther away from the first through third light-emitting devices, the greater a fluorine content per unit volume in the matrix part may be.

A second portion of the matrix part closer to the first through third light-emitting devices than the first portion of the matrix part may be to the first through third light-emitting devices may not include fluorine.

A first portion of the low refractive index layer may be less in number of the plurality of particles per unit volume than a second portion of the low refractive index layer closer to the first through third light-emitting devices than the first portion of the low refractive index layer may be to the first through third light-emitting devices.

A first portion of the low refractive index layer away from the first through third light-emitting devices may be less in number of the plurality of particles per unit volume than a second portion of the low refractive index layer close to the first through third light-emitting devices.

A first portion of the low refractive index layer far from the first through third light-emitting devices may not include the plurality of particles.

The display apparatus may further include a capping layer between the low refractive index layer and the second-color and third-color quantum dot layers to correspond to the first through third light-emitting devices.

The matrix part may be integrally formed as a single body from a bottom surface of the low refractive index layer close to the first through third light-emitting devices to a top surface of the low refractive index layer away from the first through third light-emitting devices.

According to one or more embodiments, a display apparatus includes a substrate, a first light-emitting device, a second light-emitting device, and a third light-emitting device, each including a first-color emission layer and being over the substrate, a second-color quantum dot layer over the second light-emitting device, a third-color quantum dot layer over the third light-emitting device, a low refractive index layer over the second-color quantum dot layer and the third-color quantum dot layer to correspond to the first through third light-emitting devices, and including a matrix part and a plurality of particles in the matrix part, wherein a first portion of the matrix part close to the first through third light-emitting devices includes fluorine, a first-color color filter layer over the low refractive index layer to correspond to the first light-emitting device, a second-color color filter layer over the low refractive index layer to correspond to the second light-emitting device, and a third-color color filter layer over the low refractive index layer to correspond to the third light-emitting device.

The display apparatus may further include a light-transmitting layer over the first light-emitting device, wherein the low refractive index layer is over the light-transmitting layer.

The first portion of the matrix part may be greater in fluorine content per unit volume than a second portion of the matrix part farther from the first through third light-emitting devices than the first portion of the matrix part may be to the first through third light-emitting devices.

The first portion of the matrix part may be greater in fluorine content per unit volume than a second portion of the matrix part away from the first through third light-emitting devices.

The closer to the first through third light-emitting devices, the greater a fluorine content per unit volume in the matrix part may be.

A second portion of the matrix part farther from the first through third light-emitting devices than the first portion of the matrix part may be to the first through third light-emitting devices may not include fluorine.

A first portion of the low refractive index layer may be less in number of the plurality of particles per unit volume than a second portion of the low refractive index layer farther from the first through third light-emitting devices than the first portion of the low refractive index layer may be to the first through third light-emitting devices.

A first portion of the low refractive index layer close to the first through third light-emitting devices may be less in number of the plurality of particles per unit volume than a second portion of the low refractive index layer away from the first through third light-emitting devices.

A first portion of the low refractive index layer close to the first through third light-emitting devices may not include the plurality of particles.

The display apparatus may further include a capping layer between the low refractive index layer and the first-color through third-color color filter layers to correspond to the first through third light-emitting devices.

The matrix part may be integrally formed as a single body from a bottom surface of the low refractive index layer close to the first through third light-emitting devices to a top surface of the low refractive index layer away from the first through third light-emitting devices.

Other aspects and features of the present disclosure will become more apparent from the drawings, the claims, and the detailed description.

BRIEF DESCRIPTION OF THE DRAWINGS

The above and other aspects and features of embodiments of the present disclosure will be more apparent from the following description taken in conjunction with the accompanying drawings, in which.

DETAILED DESCRIPTION

Figure 1:
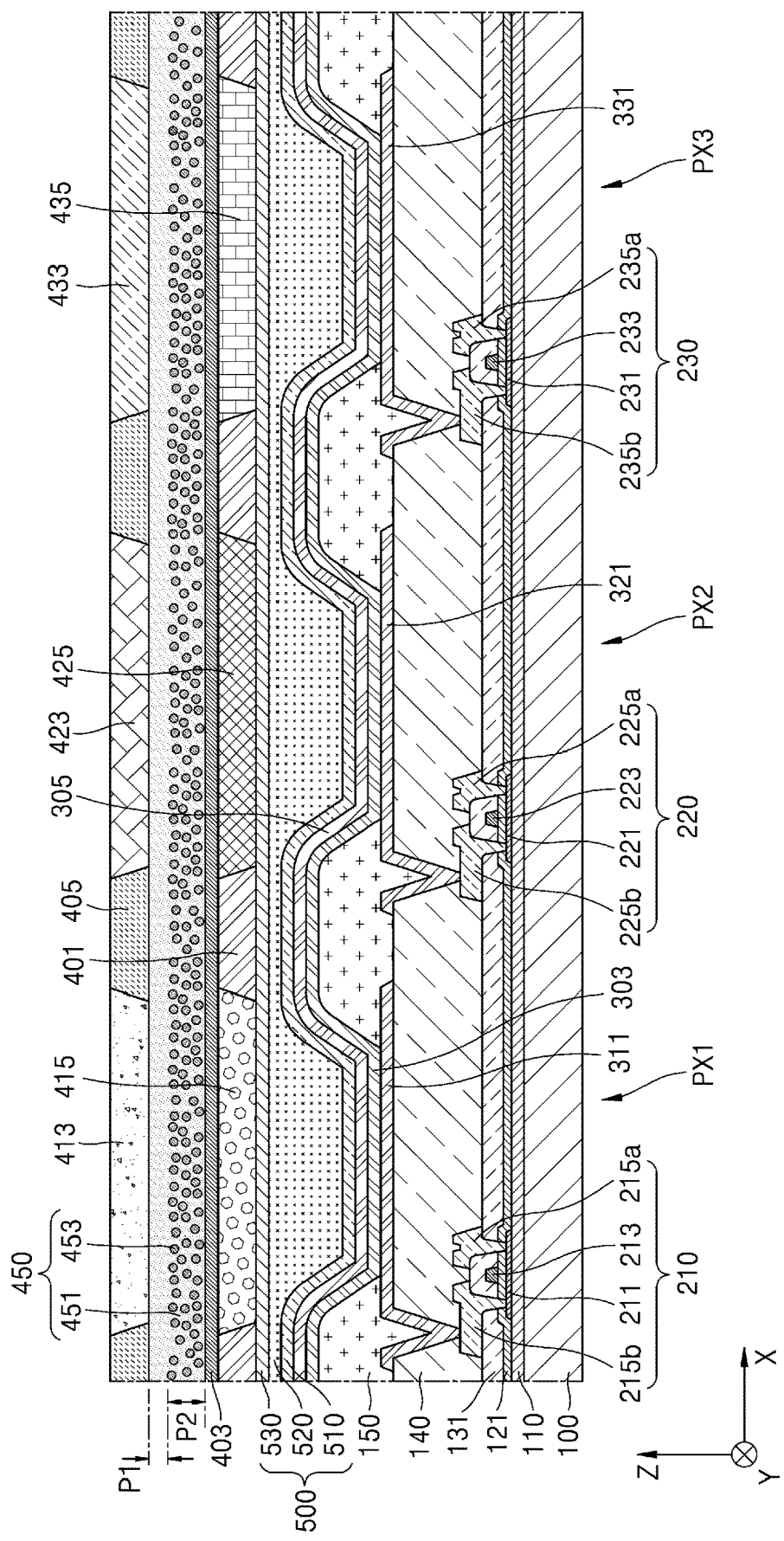
FIG. 1 is a cross-sectional view illustrating a portion of a display apparatus according to an embodiment.

Reference will now be made in more detail to embodiments, examples of which are illustrated in the accompanying drawings, wherein like reference numerals refer to like elements throughout. In this regard, the embodiments of the present disclosure may have different suitable forms and should not be construed as being limited to the descriptions set forth herein. Accordingly, some example embodiments are described below, by referring to the drawings, to explain aspects and features of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof. Also, "at least one selected from among a, b, and c" indicates only a, only b, only c, both a and b, both a and c, both b and c, all of a, b, and c, or variations thereof.

As the present disclosure allows for various suitable changes and numerous embodiments, certain embodiments will be illustrated in the drawings and described in the detailed description. Aspects and features of the present disclosure, and methods for achieving them, will be clarified with reference to embodiments described below in more detail with reference to the drawings. However, the present disclosure is not limited to the following embodiments and may be embodied in various suitable forms.

Hereinafter, embodiments will be described with reference to the accompanying drawings, wherein like elements are denoted by like reference numerals throughout and a repeated description thereof may not be provided.

It will be understood that when a component, such as a layer, a film, a region, or a plate, is referred to as being "on" another component, the component may be directly on the other component or one or more intervening components may be present therebetween. Also, sizes of elements in the drawings may be exaggerated or contracted for convenience of explanation. For example, because sizes and thicknesses of elements in the drawings may be exaggerated or contracted for convenience of explanation, the present disclosure is not limited thereto.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

In the following examples, an X-axis, a Y-axis, and a Z-axis are not limited to three axes of a rectangular coordinate system, and may be interpreted in a broader sense. For example, the X-axis, the Y-axis, and the Z-axis may be perpendicular to one another or may represent different directions that are not perpendicular to one another.

FIG. 1 is a cross-sectional view illustrating a portion of a display apparatus according to an embodiment. As shown in FIG. 1, the display apparatus according to the present embodiment includes a first pixel PX1, a second pixel PX2, and a third pixel PX3. However, this is merely an example, and the display apparatus may include more pixels. Although the first pixel PX1 through the third pixel PX3 are adjacent to one another in FIG. 1, the present disclosure is not limited thereto. For example, elements such as wirings may be located among the first pixel PX1 through the third pixel PX3. Accordingly, for example, the first pixel PX1 and the second pixel PX2 may not be located adjacent to each other. Also, cross-sections of the first pixel PX1 through the third pixel PX3 in FIG. 1 may not be cross-sections in the same direction.

The display apparatus according to the present embodiment includes a substrate 100. The substrate 100 may include (e.g., be) glass, a metal, and/or a polymer resin. When the substrate 100 is flexible and/or bendable, the substrate 100 may include (e.g., be) a polymer resin such as polyethersulfone, polyacrylate, polyetherimide, polyethylene naphthalate, polyethylene terephthalate, polyphenylene sulfide, polyarylate, polyimide, polycarbonate, and/or cellulose acetate propionate. Various suitable modifications may be made. For example, the substrate 100 may have a multi-layer structure including two layers, each including (e.g., being) a polymer resin, and a barrier layer including (e.g., being) an inorganic material such as silicon oxide, silicon nitride, and/or silicon oxynitride and disposed between the two layers.

A first pixel electrode 311, a second pixel electrode 321, and a third pixel electrode 331 are disposed over the substrate 100. In some embodiments, a plurality of display devices are disposed over the substrate 100. First through third thin-film transistors 210, 220, and 230 electrically coupled (e.g., connected) to the display devices may also be disposed over the substrate 100. In FIG. 1, organic light-emitting devices are disposed as the display devices over the substrate 100. When the organic light-emitting devices are electrically coupled (e.g., connected) to the first through third thin-film transistors 210, 220, and 230, the first through third pixel electrodes 311, 321, and 331 may be electrically coupled (e.g., connected) to the first through third thin-film transistors 210, 220, and 230.

For reference, in FIG. 1, the first thin-film transistor 210 is located in the first pixel PX1, the second thin-film transistor 220 is located in the second pixel PX2, and the third thin-film transistor 230 is located in the third pixel PX3. Each of the first through third thin-film transistors 210, 220, and 230 is electrically coupled (e.g., connected) to a pixel electrode of a display device located in the corresponding pixel. For convenience of explanation, the first thin-film transistor 210 and a display device coupled (e.g., connected) to the first thin-film transistor 210 will be described, and the description may apply to the second thin-film transistor 220 and the third thin-film transistor 230 and display devices coupled (e.g., connected) to the second thin-film transistor 220 and the third thin-film transistor 230. Thus, a description of a second semiconductor layer 221, a second gate electrode 223, a second source electrode 225a, and a second drain electrode 225b of the second thin-film transistor 220, and the second pixel electrode 321 may not be provided. Likewise, a description of a third semiconductor layer 231, a third gate electrode 233, a third source electrode 235a, and a third drain electrode 235b of the third thin-film transistor 230, and the third pixel electrode 331 may not be provided.

The first thin-film transistor 210 may include a first semiconductor layer 211 including (e.g., being) amorphous silicon, polycrystalline silicon, an organic semiconductor material, and/or an oxide semiconductor material, a first gate electrode 213, a first source electrode 215a, and a first drain electrode 215b. The first gate electrode 213 may include (e.g., be) any of various suitable conductive materials and may have any of various suitable layer structures. For example, the first gate electrode 213 may include (e.g., be) a molybdenum (Mo) layer and/or an aluminum (Al) layer. In some embodiments, the first gate electrode 213 may include (e.g., be) a TiNx layer, an Al layer, and/or a titanium (Ti) layer. Each of the first source electrode 215a and the first drain electrode 215b may also have any of various suitable conductive materials and may have any of various suitable layer structures. For example, each of the first source electrode 215a and the first drain electrode 215b may include (e.g., be) a Ti layer, an Al layer, and/or a copper (Cu) layer. The first semiconductor layer 211 may have a source region and/or a drain region, and the first source electrode 215a or the first drain electrode 215b as shown in FIG. 1 may be a wiring coupled (e.g., connected) to the source region or the drain region of the first semiconductor layer 211. For example, the first semiconductor layer 211 may have a source region, a drain region, and a channel region between the source region and the drain region; the first source electrode 215a may be coupled (e.g., connected) to the source region; and the first drain electrode 215b may be coupled (e.g., connected) to the drain region. In some embodiments, the first gate electrode 213 may overlap the channel region of the first semiconductor layer 211. This may apply to the following embodiments and modifications thereof.

In order to ensure insulation between the first semiconductor layer 211 and the first gate electrode 213, a gate insulating film 121 including (e.g., being) an inorganic material such as silicon oxide, silicon nitride, and/or silicon oxynitride may be disposed between the first semiconductor layer 211 and the first gate electrode 213. A first interlayer insulating film 131 including (e.g., being) an inorganic material such as silicon oxide, silicon nitride, and/or silicon oxynitride may be disposed over the first gate electrode 213, and the first source electrode 215a and the first drain electrode 215b may be disposed over the first interlayer insulating film 131. As such, an insulating film including (e.g., being) an inorganic material may be formed by utilizing chemical vapor deposition (CVD) and/or atomic layer deposition (ALD). This may apply to the following embodiments and modifications thereof.

A buffer layer 110 including (e.g., being) an inorganic material such as silicon oxide, silicon nitride, and/or silicon oxynitride may be disposed between the substrate 100 and the first thin-film transistor 210 having the above structure. The buffer layer 110 may planarize a top surface of the substrate 100, or may prevent, reduce, or minimize impurities from the substrate 100 and/or the like from penetrating into the first semiconductor layer 211 of the first thin-film transistor 210.

A planarization layer 140 may be disposed over the first thin-film transistor 210. For example, when an organic light-emitting device is disposed over the first thin-film transistor 210 as shown in FIG. 1, the planarization 140 may substantially planarize a top surface of a protective film covering the first thin-film transistor 210. The planarization layer 140 may include (e.g., be) an organic material such as acryl, benzocyclobutene (BCB), and/or hexamethyldisiloxane (HMDSO). Although the planarization layer 140 has a single-layer structure in FIG. 1, various suitable modifications may be made. For example, the planarization layer 140 may have a multi-layer structure.

A display device may be disposed over the planarization layer 140 of the substrate 100. An organic light-emitting device as shown in FIG. 1 may be utilized as the display device. In the first pixel PX1, the organic light-emitting device may include, for example, the first pixel electrode 311, a counter electrode 305, and an intermediate layer 303 disposed between the first pixel electrode 311 and the counter electrode 305 and including an emission layer. The first pixel electrode 311 is electrically coupled (e.g., connected) to the first thin-film transistor 210 by contacting one of the first source electrode 215a and the first drain electrode 215b through an opening portion (e.g., a contact hole) formed in the planarization layer 140 as shown in FIG. 1. The second pixel PX2 includes the second pixel electrode 321, and the third pixel PX3 includes the third pixel electrode 331. Each of the first through third pixel electrodes 311, 321, and 331 may include a light-transmitting conductive layer formed of a light-transmitting conductive oxide such as indium tin oxide (ITO), $In_2O_3$, and/or indium zinc oxide (IZO), and a reflective layer formed of a metal such as aluminum (Al) and/or silver (Ag). For example, each of the first through third pixel electrodes 311, 321, and 331 may have a 3-layer structure including ITO/Ag/ITO.

The intermediate layer 303 including the emission layer may be integrally formed over the first through third pixel electrodes 311, 321, and 331, and the counter electrode 305 on the intermediate layer 303 may also be integrally formed over the first through third pixel electrodes 311, 321, and 331. The counter electrode 305 may include a light-transmitting conductive layer formed of ITO, $In_2O_3$, and/or IZO, and may include a semi-transmissive film including (e.g., being) a metal such as silver (Ag), magnesium (Mg), and/or ytterbium (Yb). For example, the counter electrode 305 may be a semi-transmissive film including (e.g., being) MgAg and/or AgYb.

A pixel-defining layer 150 may be disposed over the planarization layer 140. The pixel-defining layer 150 has an opening corresponding to each pixel, for example, an opening through which at least a central portion of each of the first through third pixel electrodes 311, 321, and 331 is exposed, to define the pixel. For example, the pixel-defining layer 150 may cover a portion (e.g., an edge) of the first pixel electrode 311 and may have an opening that exposes another portion (e.g., a central portion) of an upper surface of the first pixel electrode 311. Also, as shown in FIG. 1, the pixel-defining layer 150 increases a distance between the counter electrode 305 and an edge of each of the first through third pixel electrodes 311, 321, and 331, to prevent an arc and/or the like from occurring at the edge of each of the first through third pixel electrodes 311, 321, and 331, or to suppress the formation of an arc and/or the like. The pixel-defining layer 150 may include (e.g., be) an organic material such as polyimide and/or hexamethyldisiloxane (HMDSO).

The intermediate layer 303 may include (e.g., be) a low molecular weight material or a high molecular weight material. When the intermediate layer 303 has a low molecular weight material, the intermediate layer 303 may have a single or multi-layer structure in which a hole injection layer (HIL), a hole transport layer (HTL), an emission layer (EML), an electron transport layer (ETL), and an electron injection layer (EIL) are stacked, and may be formed by utilizing vacuum deposition. In some embodiments, the intermediate layer 303 may include the EML and one or more of the HIL, the HTL, the ETL, and the EIL. When the intermediate layer 303 includes (e.g., is) a high molecular weight material, the intermediate layer 303 may have a structure including an HTL and an EML. In this case, the HTL may include (e.g., be) poly(3,4-ethylenedioxythiophene) (PEDOT), and the EML may include (e.g., be) a polymer material such as a polyphenylene vinylene (PPV)-based material and/or a polyfluorene-based material. The intermediate layer 303 may be formed by utilizing screen printing, inkjet printing, deposition, and/or laser-induced thermal imaging (LITI). However, the intermediate layer 303 is not limited thereto, and may have any of various suitable other structures.

Although the intermediate layer 303 may include a layer that is integrally formed over the first through third pixel electrodes 311, 321, and 331 as described above, the intermediate layer 303 may include a layer that is patterned to correspond to each of the first through third pixel electrodes 311, 321, and 331. In some embodiments, the intermediate layer 303 includes a first-color emission layer. The first-color emission layer may be integrally formed over the first through third pixel electrodes 311, 321, and 331, or may be patterned to correspond to each of the first through third pixel electrodes 311, 321, and 331. The first-color emission layer may emit light of a first wavelength band, for example, light having a wavelength of about 450 nm to about 495 nm.

The counter electrode 305 is disposed over the intermediate layer 303 to correspond to the first through third pixel electrodes 311, 321, and 331. The counter electrode 305 may be integrally formed in a plurality of organic light-emitting devices.

Because each organic light-emitting device may be easily damaged by external moisture, oxygen, and/or the like, an encapsulation layer 500 may cover and protect the organic light-emitting device. The encapsulation layer 500 may include a first inorganic encapsulation layer 510, an organic encapsulation layer 520, and a second inorganic encapsulation layer 530. The first inorganic encapsulation layer 510 and the second inorganic encapsulation layer 530, which may each include (e.g., be) an inorganic material such as silicon oxide, silicon nitride, and/or silicon oxynitride, may contact each other outside the organic encapsulation layer 520. For example, each of the first and second inorganic encapsulation layers 510 and 530 may extend beyond the organic encapsulation layer 520 in a plan view and come into contact to partially or entirely encapsulate the organic encapsulation layer 520. The organic encapsulation layer 520 may include (e.g., be), for example, polydimethylsiloxane and/or polyacrylate.

A second-color quantum dot layer 425 is disposed over a second light-emitting device located in the second pixel PX2. For example, the second-color quantum dot layer 425 is disposed over the second pixel electrode 321 of the second light-emitting device located in the second pixel PX2. Accordingly, when viewed in a direction (Z-axis direction) perpendicular to the substrate 100 (e.g., when viewed in a plan view), the second-color quantum dot layer 425 overlaps the second pixel electrode 321. The second-color quantum dot layer 425 may convert light of the first wavelength band generated by the intermediate layer 303 on the second pixel electrode 321 into light of a second wavelength band. For example, when light having a wavelength of about 450 nm to about 495 nm is generated by the intermediate layer 303 on the second pixel electrode 321, the second-color quantum dot layer 425 may convert the light into light having a wavelength of about 495 nm to about 570 nm. Accordingly, in the second pixel PX2, light having a wavelength of about 495 nm to about 570 nm is emitted to the outside.

A third-color quantum dot layer 435 is disposed over a third light-emitting device located in the third pixel PX3. For example, the third-color quantum dot layer 435 is disposed over the third pixel electrode 331 of the third light-emitting device located in the third pixel PX3. Accordingly, when viewed in the direction (Z-axis direction) perpendicular to the substrate 100 (e.g., when viewed in the plan view), the third-color quantum dot layer 435 overlaps the third pixel electrode 331. The third-color quantum dot layer 435 may convert light of the first wavelength band generated by the intermediate layer 303 on the third pixel electrode 331 into light of a third wavelength band. For example, when light having a wavelength of about 450 nm to about 495 nm is generated by the intermediate layer 303 on the third pixel electrode 331, the third-color quantum dot layer 435 may convert the light into light having a wavelength of about 630 nm to about 780 nm. Accordingly, in the third pixel PX3, light having a wavelength of about 630 nm to about 780 nm is emitted to the outside.

Each of the second-color quantum dot layer 425 and the third-color quantum dot layer 435 may have a structure in which quantum dots are dispersed in a resin. In some embodiments and modifications thereof, quantum dots may refer to semiconductor compound crystals, and may include (e.g., be) any suitable material capable of emitting light having various suitable wavelengths according to sizes of crystals. A diameter of each of the quantum dots may range, for example, from about 1 nm to about 10 nm.

Quantum dots may be synthesized by utilizing a wet chemical process, metal organic chemical deposition (MOCVD), molecular beam epitaxy (MBE), and/or the like. A wet chemical process is a method of mixing an organic solvent with a precursor material and then growing quantum dot crystals. In a wet chemical process, when crystals are grown, because an organic solvent naturally functions as a dispersant coordinated on quantum dot crystal surfaces and controls the growth of the crystals, the wet chemical process is easier than a vapor deposition method such as organic metal chemical vapor deposition (MOCVD) or molecular beam epitaxy (MBE). Also, the wet chemical process is inexpensive and may control the growth of quantum dot particles.

Such quantum dots may include (e.g., be) a group III-VI semiconductor compound, a group II-VI semiconductor compound, a group III-V semiconductor compound, a group III-VI semiconductor compound, a group I-III-VI semiconductor compound, a group IV-VI semiconductor compound, a group IV element or compound, or any combination thereof.

Examples of the group III-VI semiconductor compound may include a binary compound such as $In_2S_3$, a ternary compound such as AgInS, $AgInS_2$, CuInS, and/or $CuInS_2$, or any combination thereof.

Examples of the group II-VI semiconductor compound include a binary compound such as CdS, CdSe, CdTe, ZnS, ZnSe, ZnTe, ZnO, HgS, HgSe, HgTe, MgSe, and/or MgS, a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and/or MgZnS, a quaternary compound such as CdZnSeS, CdZnSeTe, CdZnSTe, CdHgSeS, CdHgSeTe, CdHgSTe, HgZnSeS, HgZnSeTe, and/or HgZnSTe, or any combination thereof.

Examples of the group III-V semiconductor compound include a binary compound such as GaN, GaP, GaAs, GaSb, AlN, AlP, AlAs, AlSb, InN, InP, InAs, and/or InSb, a ternary compound such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, and/or GaAlNP, a quaternary compound such as InAlNAs, InAlNSb, InAlPAs, and/or InAlPSb, or any combination thereof. The group III-V semiconductor compound may further include (e.g., be) a group II element. Examples of the group III-V semiconductor compound further including the group II element may include InZnP, InGaZnP, and/or InAlZnP.

Examples of the III-VI group semiconductor compound may include a binary compound such as GaS, GaSe, $Ga_2Se_3$, GaTe, InS, InSe, $In_2Se_3$, and/or InTe, a ternary compound such as $InGaS_3$ and/or $InGaSe_3$, or any combination thereof.

Examples of the group I-III-VI semiconductor compound may include a ternary compound such as AgInS, $AgInS_2$, CuInS, $CuInS_2$, $CuGaO_2$, $AgGaO_2$, and/or $AgAlO_2$, or any combination thereof.

Examples of the group IV-VI semiconductor compound may include a binary compound such as SnS, SnSe, SnTe, PbS, PbSe, and/or PbTe, a ternary compound such as SnSeS, SnSeTe, SnSTe, PbSeS, PbSeTe, PbSTe, SnPbS, SnPbSe, and/or SnPbTe, a quaternary compound such as SnPbSSe, SnPbSeTe, and/or SnPbSTe, or any combination thereof.

Examples of the group IV element or compound may include a single-element compound such as Si and/or Ge, a binary compound such as SiC and/or SiGe, or any combination thereof.

Elements included in a multi-element compound such as a binary compound, a ternary compound, and/or a quaternary compound may exist in particles at a uniform concentration or a non-uniform concentration.

A quantum dot may have a core-shell structure or a single structure having a uniform element concentration in the quantum dot. For example, a material included in (e.g., composing) a core and a material included in (e.g., composing) a shell may be different from each other. The shell of the quantum dot may serve as a protective layer for maintaining semiconductor characteristics by preventing, suppressing, or reducing the occurrence of, chemical degeneration of the core and/or a charging layer for providing electrophoretic characteristics to the quantum dot. The shell may have a single or multi-layer structure. An interface between the core and the shell may have a concentration gradient in which an element concentration in the shell gradually decreases toward the center.

Examples of the shell of the quantum dot may include (e.g., be) a metallic or non-metallic oxide, a semiconductor compound, or a combination thereof. Examples of the metallic or non-metallic oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO, a ternary compound such as $MgAl_2O_4$, $CoFe_2O_4$, $NiFe_2O_4$, and/or $CoMnO_4$, or any combination thereof. Examples of the semiconductor compound may include, as described above, a group III-VI semiconductor compound, a group II-VI semiconductor compound, a group III-V semiconductor compound, a group III-VI semiconductor compound, a group I-III-VI semiconductor compound, a group IV-VI semiconductor compound, or any combination thereof. Examples of the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

A quantum dot may have a full width at half maximum (FWHM) of an emission wavelength spectrum of about 45 nm or less. In some embodiments, the FWHM may be about 40 nm or less. In some embodiments, the FWHM may be about 30 nm or less. When the FWHM is in this range, color purity or color reproducibility may be improved. Also, because light emitted through the quantum dot is emitted in all directions, an optical viewing angle may be improved.

A quantum dot may be a spherical, pyramid, multi-arm, or cubic-shaped nano particle, nano-tube, nano-wire, nano-fiber, or nano-plate particle.

Because an energy band gap (e.g., a wavelength band) may be adjusted by adjusting a size of a quantum dot, light of various suitable wavelength bands may be obtained through a quantum dot emission layer. Accordingly, a light-emitting device for emitting light having various suitable wavelengths may be realized by utilizing quantum dots having different sizes. In more detail, sizes of quantum dots may be selected or set to emit red light, green light, and/or blue light. Also, sizes of quantum dots may be selected or set to combine light of various colors and emit white light.

Each of the second-color quantum dot layer 425 and the third-color quantum dot layer 435 may include a scatterer. Any suitable resin included in each of the second-color quantum dot layer 425 and the third-color quantum dot layer 435 may be utilized as long as it has suitable dispersion characteristics for the scatterer and transmits light. For example, a polymer resin such as an acrylic resin, an imide resin, and/or an epoxy resin may be utilized as the resin included in each of the second-color quantum dot layer 425 and the third-color quantum dot layer 435.

The scatterer included in each of the second-color quantum dot layer 425 and the third-color quantum dot layer 435 may be particles, for example, light-scattering particles, having a refractive index different from that of the light-transmitting resin included in each of the second-color quantum dot layer 425 and the third-color quantum dot layer 435. The scatterer is not limited. The scatterer may be capable of forming an optical interface between the scatterer and the light-transmitting resin and of partially scattering transmitted light. For example, the scatterer may be metal oxide particles or organic particles. Examples of a metal oxide for the scatterer may include titanium oxide ($TiO_2$), zirconium oxide ($ZrO_2$), aluminum oxide ($Al_2O_3$), indium oxide ($In_2O_3$), zinc oxide ZnO, and/or tin oxide ($SnO_2$), and examples of an organic material for the scatterer may include an acrylic resin and/or an urethane resin. The scatterer may scatter light in several directions regardless of an angle of incidence without substantially converting a wavelength of incident light. Accordingly, the scatterer may improve side visibility of the display apparatus. Also, the scatterer included in each of the second-color quantum dot layer 425 and the third-color quantum dot layer 435 may increase a chance of light incident on the second-color quantum dot layer 425 and the third-color quantum dot layer 435 to meet (e.g., be incident on or interact with) quantum dots, thereby improving light conversion efficiency.

In the first pixel PX1, light having a first wavelength generated by the intermediate layer 303 is emitted to the outside without wavelength conversion. Accordingly, the first pixel PX1 does not include a quantum dot layer. Hence, a light-transmitting layer 415 formed of a light-transmitting resin is disposed over a first light-emitting device located in the first pixel PX1. For example, the light-transmitting layer 415 is disposed over the first pixel electrode 311 of the first light-emitting device located in the first pixel PX1. Accordingly, when viewed in the direction (Z-axis direction) perpendicular to the substrate 100 (e.g., when viewed in the plan view), the light-transmitting layer 415 overlaps the first pixel electrode 311.

The light-transmitting layer 415 may include a scatterer, and any suitable resin included in the light-transmitting layer 415 may be utilized as long as it has suitable dispersion characteristics for the scatterer and transmits light. For example, a polymer resin such as an acrylic resin, an imide resin, and/or an epoxy resin may be utilized as the resin included in the light-transmitting layer 415.

The scatterer included in the light-transmitting layer 415 may be particles, for example, light-scattering particles, having a refractive index different from that of the light-transmitting resin included in the light-transmitting layer 415. The scatterer is not particularly limited. For example, the scatterer may be capable of forming an optical interface between the scatterer and the light-transmitting resin and of partially scattering transmitted light. For example, the scatterer may be metal oxide particles or organic particles. Examples of a metal oxide for the scatterer may include titanium oxide ($TiO_2$), zirconium oxide ($ZrO_2$), aluminum oxide ($Al_2O_3$), indium oxide ($In_2O_3$), zinc oxide (ZnO), and/or tin oxide ($SnO_2$), and examples of an organic material for the scatterer may include an acrylic resin and/or a urethane resin. The scatterer may scatter light in several directions regardless of an angle of incidence without substantially converting a wavelength of incident light (lambertian reflection). Accordingly, the scatterer may improve side visibility of the display apparatus.

The light-transmitting layer 415, the second-color quantum dot layer 425, and the third-color quantum dot layer 435 are disposed to respectively correspond to the first pixel electrode 311, the second pixel electrode 321, and the third pixel electrode 331 as described above. To this end, a barrier layer 401 having through-holes corresponding to the first pixel electrode 311, the second pixel electrode 321, and the third pixel electrode 331 may be disposed over the encapsulation layer 500. In some embodiments, the barrier layer 401 may separate or space apart (e.g., in the plan view) the light-transmitting layer 415, the second-color quantum dot layer 425, and the third-color quantum dot layer 435. When the through-holes of the barrier layer 401 correspond to the first through third pixel electrodes 311, 321, and 331, it means that when viewed in the direction (Z-axis direction) normal or perpendicular to the substrate 100 (e.g., when viewed in the plan view), the through-holes overlap the first pixel electrode 311, the second pixel electrode 321, and the third pixel electrode 331. In some embodiments, the light-transmitting layer 415, the second-color quantum dot layer 425, and the third-color quantum dot layer 435 may be disposed in through-holes of the barrier layer 401 that respectively correspond to the first pixel electrode 311, the second pixel electrode 321, and the third pixel electrode 331. The barrier layer 401 may include (e.g., be) any of various suitable materials, for example, an inorganic material such as silicon oxide, silicon nitride, and/or silicon oxynitride.

A capping layer 403 is disposed over the light-transmitting layer 415, the second-color quantum dot layer 425, and the third-color quantum dot layer 435. The capping layer 403 may be integrally formed to correspond to the first light-emitting device of the first pixel PX1, the second light-emitting device of the second pixel PX2, and the third light-emitting device of the third pixel PX3. The capping layer 403 may include (e.g., be) an inorganic material such as silicon oxide, silicon nitride, and/or silicon oxynitride.

A low refractive index layer 450 is disposed over the capping layer 403. For example, the low refractive index layer 450 is disposed over the light-transmitting layer 415, the second-color quantum dot layer 425, and the third quantum dot layer 435 to correspond to the first light-emitting device of the first pixel PX1, the second light-emitting device of the second pixel PX2, and the third light-emitting device of the third pixel PX3. The low refractive index layer 450 includes a matrix part 451 and a plurality of particles 453 in the matrix part 451. A first portion P1 of the low refractive index layer 450 away from the first light-emitting device of the first pixel PX1, the second light-emitting device of the second pixel PX2, and the third light-emitting device of the third pixel PX3 (in +Z-axis direction (positive Z-axis direction)) includes fluorine. For example, the matrix part 451 of the first portion P1 of the low refractive index layer 450 includes fluorine. For example, a first portion of the matrix part 451 corresponding to the first portion P1 of the low refractive index layer 450 includes fluorine. In some embodiments, the first portion P1 of the low refractive index layer 450 may be an uppermost portion of the low refractive index layer 450.

A first-color color filter layer 413, a second-color color filter layer 423, and a third-color color filter layer 433 are disposed over the low refractive index layer 450. For example, the first-color color filter layer 413 is disposed over the low refractive index layer 450 to correspond to the first light-emitting device located in the first pixel PX1, the second-color color filter layer 423 is disposed over the low refractive index layer 450 to correspond to the second light-emitting device located in the second pixel PX2, and the third-color color filter layer 433 is disposed over the low refractive index layer 450 to correspond to the third light-emitting device located in the third pixel PX3. For example, the first-color color filter layer 413 is disposed over the first pixel electrode 311 of the first light-emitting device located in the first pixel PX1, the second-color color filter layer 423 is disposed over the second pixel electrode 321 of the second light-emitting device located in the second pixel PX2, and the third-color color filter layer 433 is disposed over the third pixel electrode 331 of the third light-emitting device located in the third pixel PX3. Accordingly, when viewed in the direction (Z-axis direction) perpendicular to the substrate 100 (e.g., when viewed in the plan view), the first-color color filter layer 413 overlaps the first pixel electrode 311, the second-color color filter layer 423 overlaps the second pixel electrode 321, and the third-color color filter layer 433 overlaps the third pixel electrode 331.

The first-color color filter layer 413 may pass therethrough (e.g., may transmit) only light having a wavelength of about 450 nm to about 495 nm, the second-color color filter layer 423 may pass therethrough (e.g., may transmit) only light having a wavelength of about 495 nm to about 570 nm, and the third-color color filter layer 433 may pass therethrough (e.g., may transmit) only light having a wavelength of about 630 nm to about 780 nm. For example, the first-color color filter layer 413, the second-color color filter layer 423, and the third-color color filter layer 433 may respectively transmit only blue light, green light, and red light. The first-color through third-color color filter layers 413, 423, and 433 may reduce reflection of external light in the display apparatus.

For example, when external light reaches the first-color color filter layer 413, only light having a set or pre-set wavelength passes through the first-color color filter layer 413 as described above, and light having other wavelengths is absorbed by the first-color color filter layer 413. Accordingly, among external light incident on the display apparatus, only light having a set or pre-set wavelength passes through the first-color color filter layer 413 as described above, and part of the light is reflected at (e.g., on) the counter electrode 305 or at (e.g., on) the first pixel electrode 311 under the first-color color filter layer 413 and is then emitted to the outside again. As a result, because only part of external light incident on a place where the first pixel PX1 is located is reflected to the outside, reflection of the external light may be reduced. This description may also apply to the second-color color filter layer 423 and the third-color color filter layer 433.

A black matrix 405 including (e.g., being) a carbon black and/or the like may be disposed between the first-color through third-color color filter layers 413, 423, and 433. For example, the black matrix 405 may define, separate and/or space apart (e.g., in the plan view) the first-color through third-color color filter layers 413, 423, and 433. In this case, the black matrix 405 may have through-holes corresponding to the first pixel electrode 311, the second pixel electrode 321, and the third pixel electrode 331, like the barrier layer 401 (e.g., similar to the through-holes of the barrier layer 401). In some embodiments, the display apparatus does not include the black matrix 405. In this case, when viewed in the direction (Z-axis direction) perpendicular to the substrate 100 (e.g., when viewed in the plan view), the first-color through third-color color filter layers 413, 423, and 433 may at least partially overlap each other between the first pixel PX1, the second pixel PX2, and the third pixel PX3 (e.g., in areas between the first pixel PX1, the second pixel PX2, and the third pixel PX3 in the plan view).

A refractive index (index of refraction) of the low refractive index layer 450 is lower than a refractive index of a layer under (e.g., immediately under) the low refractive index layer 450. In the display apparatus as shown in FIG. 1, a refractive index of the low refractive index layer 450 is lower than a refractive index of the capping layer 403 under the low refractive index layer 450. When the capping layer 403 includes (e.g., is) an inorganic material such as silicon oxide, silicon nitride, and/or silicon oxynitride, a refractive index of the capping layer 403 may range from about 1.4 to about 1.5. A refractive index of the low refractive index layer 450 is lower than that of the capping layer 403, and may range, for example, from about 1.1 to about 1.3. Because a refractive index of the low refractive index layer 450 is lower than a refractive index of a layer under the low refractive index layer 450, part of light traveling from the capping layer 403 under the low refractive index layer 450 to the low refractive index layer 450 is totally reflected at an interface (e.g., an interface between the capping layer 403 and the low refractive index layer 450) and travels downward again through the capping layer 403.

In the second pixel PX2, the totally reflected light travels through the capping layer 403 toward the second-color quantum dot layer 425 under the capping layer 403. When the totally reflected light is light already converted by the second-color quantum dot layer 425 into light having a wavelength of about 495 nm to about 570 nm, the light is reflected at (e.g., on) the second pixel electrode 321 or at (e.g., on) the counter electrode 305 under the second-color quantum dot layer 425, passes through the low refractive index layer 450 again, and is emitted to the outside. When the totally reflected light is light that has a wavelength of about 450 nm to about 495 nm and passes through (e.g., has already passed through) the second-color quantum dot layer 425 without being converted by the second-color quantum dot layer 425 into light having a wavelength of about 495 nm to about 570 nm, the totally reflected light may pass through the second quantum dot layer 425 again and may be converted by the second-color quantum dot layer 425 into light having a wavelength of about 495 nm to about 570 nm. Next, the light is reflected at (e.g., on) the second pixel electrode 321 or at (e.g., on) the counter electrode 305 under the second-color quantum dot layer 425, passes through the low refractive index layer 450 again, and is emitted to the outside.

In the third pixel PX3, the totally reflected light travels through the capping layer 403 toward the third-color quantum dot layer 435 under the capping layer 403. When the totally reflected light is light already converted by the third-color quantum dot layer 435 into light having a wavelength of about 630 nm to about 780 nm, the light is reflected at (e.g., on) the third pixel electrode 331 or at (e.g., on) the counter electrode 305 under the third-color quantum dot layer 435, passes through the low refractive index layer 450 again, and is emitted to the outside. When the totally reflected light is light that has a wavelength of about 450 nm to about 495 nm and passes through (e.g., has already passed through) the third-color quantum dot layer 435 without being converted into light having a wavelength of about 630 nm to about 780 nm, the totally reflected light may pass through the third-color quantum dot layer 435 again and may be converted by the third-color quantum dot layer 435 into light having a wavelength of about 630 nm to about 780 nm. Next, the light is reflected at (e.g., on) the third pixel electrode 331 or at (e.g., on) the counter electrode 305 under the third-color quantum dot layer 435, passes through the low refractive index layer 450 again, and is emitted to the outside.

In the display apparatus according to the present embodiment, because light generated by the second pixel PX2 or the third pixel PX3 is minimized or blocked from being emitted to the outside without being converted by the second-color quantum dot layer 425 or the third-color quantum dot layer 435, luminous efficiency may be significantly improved.

As described above, the low refractive index layer 450 has a refractive index lower than a refractive index of the capping layer 403 which ranges from about 1.4 to about 1.5. For example, a refractive index of the low refractive index layer 450 may range, for example, from about 1.1 to about 1.3. The low refractive index layer 450 includes the matrix part 451 and the plurality of particles 453 in the matrix part 451.

The matrix part 451 may include (e.g., be) a polymer material. The matrix part 451 may include at least one selected from among an acrylic polymer, a silicon-based polymer, a urethane-based polymer, and an imide-based polymer. For example, the matrix part 451 may include (e.g., be) any one polymer material selected from among an acrylic polymer, a silicon-based polymer, a urethane-based polymer, and an imide-based polymer, or a combination of a plurality of polymer materials. Also, the matrix part 451 may include (e.g., be) at least one selected from among a siloxane polymer, a silsesquioxane polymer, an acrylic polymer substituted with a fluorine atom, a silicon-based polymer substituted with a fluorine atom, a urethane-based polymer substituted with a fluorine atom, and an imide-based polymer substituted with a fluorine atom. The matrix part 451 may be formed of siloxane, acryl, polyimide, urethane, and/or epoxy. The matrix part 451 may be formed by solidifying a polymer resin such as siloxane, acryl, polyimide, urethane, and/or epoxy in a high-temperature process and/or an ultraviolet treatment process.

The plurality of particles 453 in the matrix part 451 may be silica. A coating layer formed of an inorganic material may be on surfaces of the plurality of particles 453. The coating layer may include (e.g., be) silicon oxide and/or magnetite ($Fe_3O_4$). In some embodiments, the plurality of particles 453 may be hollow particles filled with air. When the plurality of particles 453 are hollow particles, the plurality of particles 453 may include silicon oxide, acryl, polyimide, urethane, styrene, and/or epoxy. A refractive index of the plurality of particles 453 may be, for example, equal to greater than 1.1 and equal to or less than 1.3. A refractive index of the low refractive index layer 450 may be equal to or greater than 1.1 and equal to or less than 1.3 by adjusting a refractive index of the low refractive index layer 450 by causing an average diameter of each of the plurality of particles 453 included in the low refractive index layer 450 to be equal to or greater than 20 nm and equal to or less than 150 nm. For example, the average diameter of the plurality of particles 453 may be within the range of about 20 nm to about 150 nm and may be set such that the refractive index of the low refractive index layer 450 is set within the range of 1.1 to 1.3.

In a manufacturing process, after the low refractive index layer 450 is formed, it is useful (e.g., necessary) to prevent a refractive index of the low refractive index layer 450 from increasing, or to reduce or minimize an increase of the refractive index of the low refractive index layer 450. For example, after the low refractive index layer 450 is formed, a process of forming the black matrix 405 and/or the first-color through third-color color filter layers 413, 423, and 433 on the low refractive index layer 450 (as shown in FIG. 1) is performed. Because the process of forming the black matrix 405 and/or the first-color through third-color color filter layers 413, 423, and 433 utilizes a solution, it is useful (e.g., necessary) to minimize or block the solution from penetrating into the low refractive index layer 450. This is because, there is a void or the like that is an empty space in the matrix part 451 of the low refractive index layer 450, and when the solution penetrates into the low refractive index layer 450, the solution fills the void or the like, thereby increasing a refractive index of the low refractive index layer 450.

To this end, after the low refractive index layer 450 is formed, it may be considered that an additional capping layer is formed on a top surface (e.g., a surface furthest along the +Z-axis direction) of the low refractive index layer 450 by utilizing silicon oxide, silicon nitride, and/or silicon oxynitride. However, in this case, because a process of forming the additional capping layer has to be performed, a time taken to manufacture the display apparatus increases and a defect rate increases.

However, in the display apparatus according to the present embodiment, in order to simplify a manufacturing process without increasing a refractive index of the low refractive index layer 450 in a subsequent process, the first portion P1 of the low refractive index layer 450 (e.g., the matrix part 451 of the first portion P1 of the low refractive index layer 450) far (e.g., far along the +Z-axis direction) from the first light-emitting device, the second light-emitting device, and the third light-emitting device includes fluorine. The fluorine is a hydrophobic material. Accordingly, the first portion P1 of the low refractive index layer 450 is hydrophobic. Hence, even when a solution is utilized in a subsequent process after the low refractive index layer 450 is formed, the solution may be prevented or blocked from penetrating into the first portion P1 of the low refractive index layer 450, or the penetration of the solution into the first portion P1 of the low refractive index layer 450 may be minimized. Accordingly, a refractive index of the low refractive index layer 450 may be effectively prevented from increasing after the low refractive index layer 450 is formed, or an increase of the refractive index of the low refractive index layer 450 may be effectively reduced or minimized. A thickness of the first portion P1 may range, for example, from about 10 nm to about 1000 nm.

When an organic material layer and an inorganic material layer contact each other, stress may occur at an interface and peeling or the like may occur between the organic material layer and the inorganic material layer. However, in the display apparatus according to the present embodiment, a capping layer that is an inorganic material is not added between the low refractive index layer 450 that is an organic material layer and the first-color through third-color color filter layers 413, 423, and 433 that are organic material layers. Accordingly, peeling and/or the like due to stress at an interface may be effectively prevented or reduced.

Figure 2:
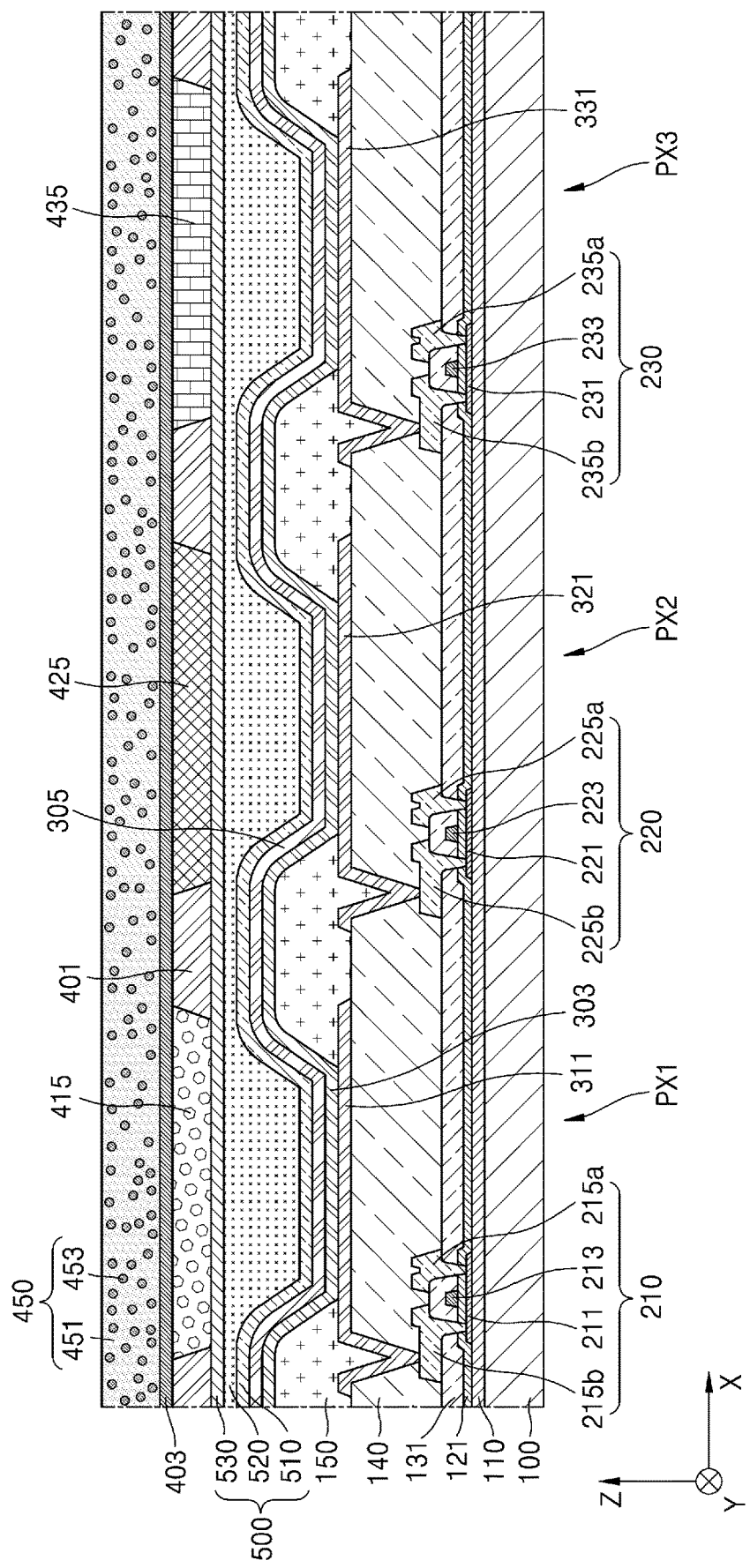
FIGS. 2 and 3 are each a cross-sectional view illustrating a process of manufacturing the display apparatus of FIG. 1, according to an embodiment.
Figure 3:
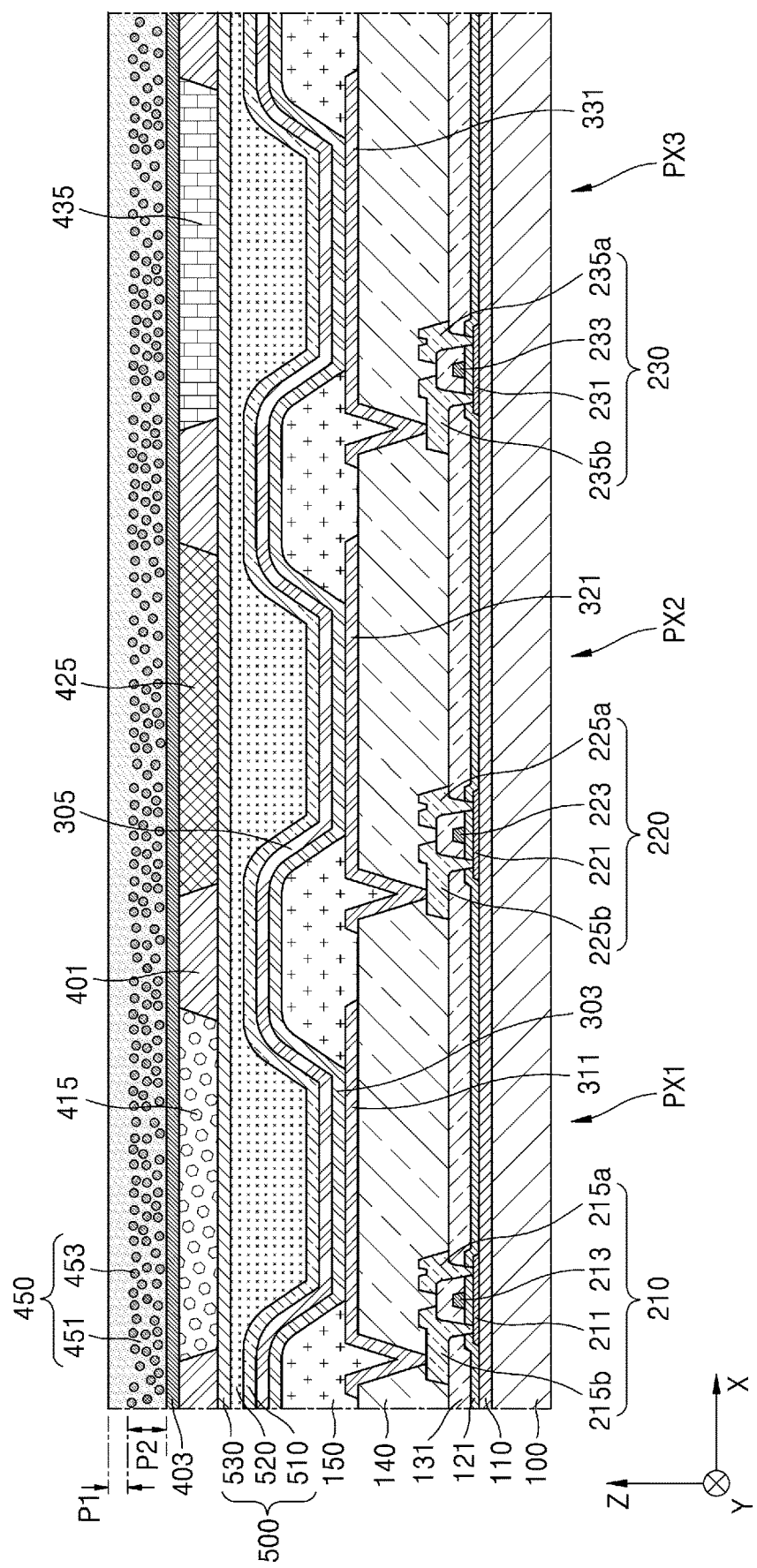

FIGS. 2 and 3 are cross-sectional views illustrating a process of manufacturing the display apparatus of FIG. 1.

As shown in FIG. 2, after the capping layer 403 is formed, a material for forming the low refractive index layer 450 is applied to (e.g., on) the capping layer 403. The material for forming the low refractive index layer 450 may contain, for example, 80 wt % of solvent and 20 wt % of solid content. Diethylene glycol ethyl methyl ether (MEDG) and/or propylene glycol methyl ether acetate (PGMEA) may be utilized as the solvent. In some embodiments, 50 wt % of the solid content may be a resin, and the remaining 50 wt % of the solid content may be the plurality of particles 453 and a small amount of curing agent and/or dispersant. When the plurality of particles 453 are less than 40 wt % of the solid content, a refractive index of the low refractive index layer 450 may not be sufficiently lowered, and when the plurality of particles 453 are more than 70 wt % of the solid content, a bonding force with the matrix part 451 may be insufficient and/or dispersibility may be insufficient. Accordingly, the plurality of particles 453 may be equal to or greater than 40 wt % and equal to or less than 70 wt % of the solid content, and in some embodiments may be 50 wt %.

The material for forming the low refractive index layer 450 may not be directly utilized, and a material for forming the low refractive index layer 450 which is finally utilized may be prepared by adding fluorine to the material for forming the low refractive index layer 450. When the material for forming the low refractive index layer 450 in a liquid state is applied to the capping layer 403, the plurality of particles 453 are substantially uniformly dispersed in the material for forming the low refractive index layer 450 as shown in FIG. 2.

Next, a thermal curing process is performed. First, pre-baking may be performed at 100° C. for about 50 seconds to about 100 seconds. In this process, most of the solvent is removed. The fluorine in the material for forming the low refractive index layer 450 moves in a direction (+Z-axis direction) away from the capping layer 403. The fluorine is hydrophobic and thus moves closer to air. For reference, as the fluorine moves closer to the air, the plurality of particles 453 move in a direction (−Z-axis direction (negative Z-axis direction)) opposite to the direction in which the fluorine moves. After the pre-baking, main curing may be performed at 180° C. for about 30 minutes.

After this process, as shown in FIG. 3, the first portion P1 of the low refractive index layer 450 (e.g., the matrix part 451 of the first portion P1 of the low refractive index layer 450) far (e.g., far in the +Z-axis direction) from the first light-emitting device, the second light-emitting device, and the third light-emitting device includes the fluorine. Next, when the black matrix 405 and/or the first-color through third-color color filter layers 413, 423, and 433 are formed on the low refractive index layer 450, because the first portion P1 of the low refractive index layer 450 (e.g., the matrix part 451 of the first portion P1 of the low refractive index layer 450) includes the fluorine that is hydrophobic, a solution utilized in a process of forming the black matrix 405 and/or the first-color through third-color color filter layers 413, 423, and 433 may be blocked from penetrating into the low refractive index layer 450, or an amount of the solution that penetrates into the low refractive index layer 450 may be reduced or minimized. Accordingly, in the display apparatus according to the present embodiment, without performing a process of forming an additional capping layer in addition to a process of forming the low refractive index layer 450, a refractive index of the low refractive index layer 450 may be effectively prevented from increasing after the low refractive index layer 450 is formed, or an increase of the refractive index of the low refractive index layer 450 may be reduced or minimized. The same effect may be achieved even when ultraviolet curing or the like instead of thermal curing is utilized. This may apply to the following embodiments and modifications thereof.

In the display apparatus according to the present embodiment, a fluorine content per unit volume in the first portion P1 of the low refractive index layer 450 (e.g., the matrix part 451 of the first portion P1 of the low refractive index layer 450) is greater than a fluorine content per unit volume in a second portion P2 of the low refractive index layer 450 (e.g., the matrix part 451 of the second portion P2 of the low refractive index layer 450, for example, a second portion of the matrix part 451 that corresponds to the second portion P2 of the low refractive index layer 450) close (e.g., close along the −Z-axis direction) to the first through third light-emitting devices in a direction. In some embodiments, the first portion P1 may be above the second portion P2 such that the second portion P2 is between the capping layer 403 and the first portion P1. In some embodiments, a fluorine content per unit volume in the first portion P1 of the low refractive index layer 450 (e.g., the matrix part 451 of the first portion P1 of the low refractive index layer 450) is greater than a fluorine content per unit volume in the second portion P2, which is closer to the first through third light-emitting devices than the first portion P1 of the low refractive index layer 450 is to the first through third light-emitting devices. As used herein, when one portion of a first component is described as being "close to" a second component, it may mean, for example, that the one portion is closer to the second component than another portion of the first component is to the second component. As used herein, when one portion of a first component is described as being "away from" or "far from" a second component, it may mean, for example, that the one portion is farther from the second component than another portion of the first component is to the second component.

As described above, the fluorine in the material for forming the low refractive index layer 450 moves in the direction (+Z-axis direction) away from the capping layer 403 in a process of forming the low refractive index layer 450. Hence, the farther away from the first through third light-emitting devices, the greater a fluorine content per unit volume in the matrix part 451. For example, the fluorine content per unit volume in the matrix part 451 may increase as it goes from a portion of the matrix part 451 close (e.g., close in the −Z-axis direction) to the first through third light-emitting devices to a portion of the matrix part 451 away (e.g., away in the +Z-axis direction) from the first through third light-emitting devices. For example, the fluorine content per unit volume (e.g., fluorine concentration) may increase in the matrix part 451 along a direction away from the first through third light-emitting devices. For example, the fluorine content per unit volume in the matrix part 451 may increase (e.g., linearly or nonlinearly) along the +Z-axis direction, for example, from a bottom surface of the low refractive index layer 450 to an upper surface of the low refractive index layer 450. In some embodiments, the fluorine content per unit volume in the matrix part 451 increases with increasing distance away from the first through third light-emitting devices.

A change in a fluorine content in the matrix part 451 may be checked by utilizing various suitable methods. For example, a change in a fluorine content (e.g., fluorine content per unit volume) in a thickness direction (Z-axis direction) in the matrix part 451 may be measured by utilizing time-of-flight secondary-ion mass spectrometry (TOF-SIMS).

As the fluorine moves closer to the air in a thermal curing process as described above, the plurality of particles 453 move in a direction (−Z-axis direction) opposite to the direction in which the fluorine moves. Hence, the number of the plurality of particles 453 per unit volume in the first portion P1 of the low refractive index layer 450 far (e.g., far along the +Z-axis direction) from the first through third light-emitting devices is less than the number of the plurality of particles 453 per unit volume in the second portion P2 of the low refractive index layer 450 close (e.g., close along the −Z-axis direction) to the first through third light-emitting devices. For example, the number of the plurality of particles 453 per unit volume in the first portion P1 of the low refractive index layer 450 far (e.g., far along the +Z-axis direction) from the first through third light-emitting devices is less than the number of the plurality of particles 453 per unit volume in the second portion P2, which is closer to the first through third light-emitting devices than the first portion P1 of the low refractive index layer 450. For example, the number of the plurality of particles 453 per unit volume in the low refractive index layer may decrease (e.g., linearly or nonlinearly) along the +Z-axis direction, for example, from the bottom surface of the low refractive index layer 450 to the upper surface of the low refractive index layer 450.

Figure 4:
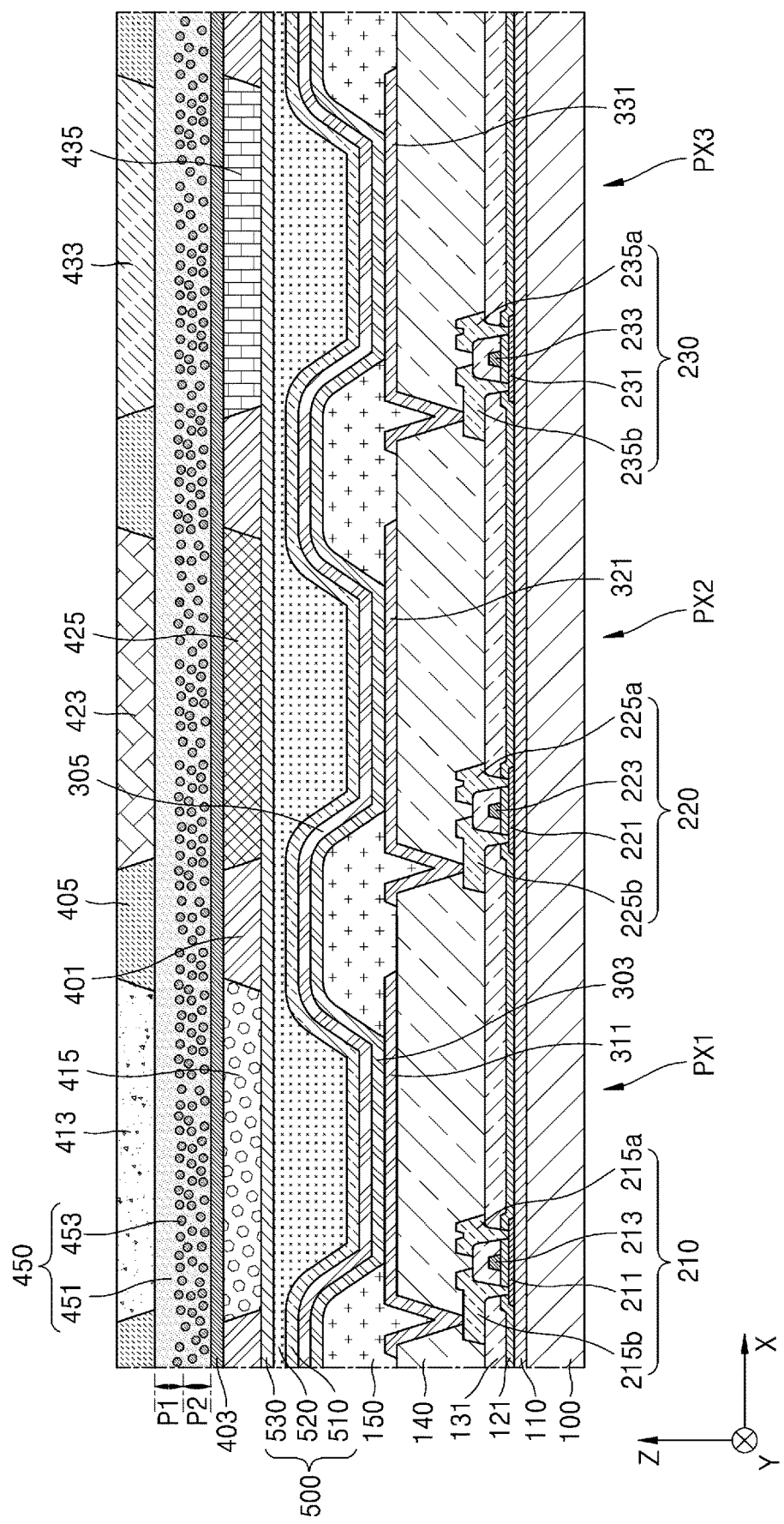
FIG. 4 is a cross-sectional view illustrating a portion of a display apparatus according to another embodiment.

In FIG. 1, the particles 453 hardly exist in the first portion P1 of the low refractive index layer 450 far (e.g., far along the +Z-axis direction) from the first through third light-emitting devices. However, as shown in FIG. 4, which is a cross-sectional view illustrating a portion of a display apparatus according to another embodiment, some of the particles 453 may be included in the first portion P1 of the low refractive index layer 450. This is because, as the amount of fluorine added to the material for forming the low refractive index layer 450 increases to form the low refractive index layer 450, a thickness of the first portion P1 including the fluorine may increase.

In the above embodiments, the matrix part 451 is integrally formed from the bottom surface of the low refractive index layer 450 close (e.g., close along the −Z-axis direction) to the first through third light-emitting devices to a top surface of the low refractive index layer 450 far (e.g., far along the +Z-axis direction) from the first through third light-emitting devices. For example, there is no interface between the first portion P1 and the second portion P2. This is because the first portion P1 and the second portion P2 are not formed through separate processes.

Figure 5:
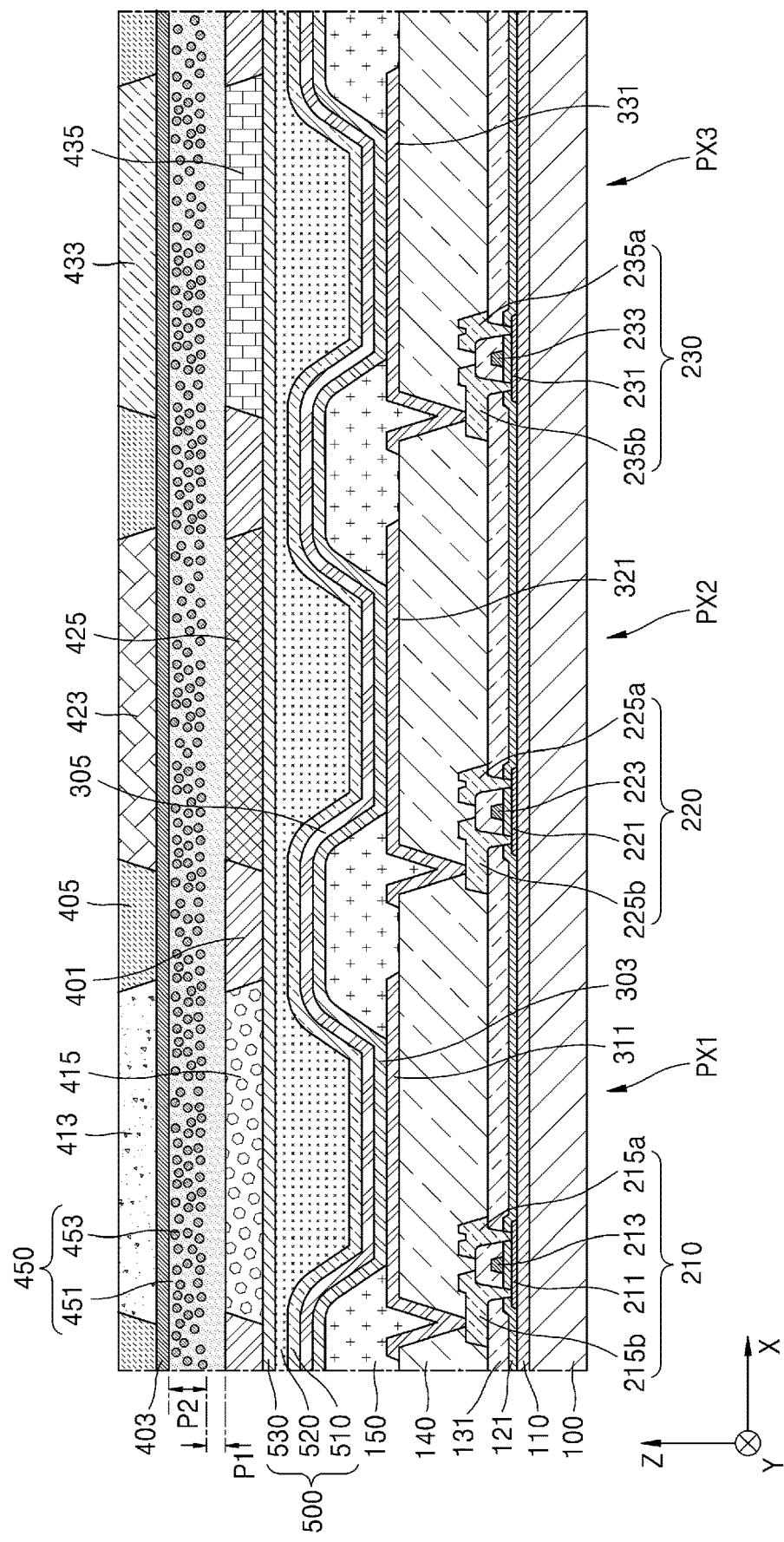
FIG. 5 is a cross-sectional view illustrating a portion of a display apparatus according to another embodiment.

FIG. 5 is a cross-sectional view illustrating a portion of a display apparatus according to another embodiment. The display apparatus according to the present embodiment is different from the display apparatus of FIG. 1 in a position of the capping layer 403 and positions of the first portion P1 and the second portion P2 of the low refractive index layer 450. As shown in FIGS. 1 and 5, the display apparatus according to the present embodiment may also be different from the display apparatus of FIG. 1 in inclined directions of inner surfaces of through-holes of the barrier layer 401 or inner surfaces of through-holes of the black matrix 405.

In the display apparatus according to the present embodiment, the light-transmitting layer 415, the second-color quantum dot layer 425, and the third-color quantum dot layer 435 are disposed over the encapsulation layer 500. The low refractive index layer 450 is disposed over the light-transmitting layer 415, the second-color quantum dot layer 425, and the third-color quantum dot layer 435. For example, the low refractive index layer 450 is disposed over the light-transmitting layer 415, the second-color quantum dot layer 425, and the third-color quantum dot layer 435 to correspond to the first light-emitting device of the first pixel PX1, the second light-emitting device of the second pixel PX2, and the third light-emitting device of the third pixel PX3. The low refractive index layer 450 includes the matrix part 451 and the plurality of particles 453 in the matrix part 451. The first portion P1 of the low refractive index layer 450 (e.g., the matrix part 451 of the first portion P1 of the low refractive index layer 450) close (e.g., close along the −Z-axis direction) to the first light-emitting device of the first pixel PX1, the second light-emitting device of the second pixel PX2, and the third light-emitting device of the third pixel PX3 includes fluorine.

The first-color color filter layer 413, the second-color color filter layer 423, and the third-color color filter layer 433 are disposed over the low refractive index layer 450. In more detail, the first-color color filter layer 413 is disposed over the low refractive index layer 450 to correspond to the first light-emitting device located in the first pixel PX1, the second-color color filter layer 423 is disposed over the low refractive index layer 450 to correspond to the second light-emitting device located in the second pixel PX2, and the third-color color filter layer 433 is disposed over the low refractive index layer 450 to correspond to the third light-emitting device located in the third pixel PX3. For example, the first-color color filter layer 413 is disposed over the first pixel electrode 311 of the first light-emitting device located in the first pixel PX1, the second-color color filter layer 423 is disposed over the second pixel electrode 321 of the second light-emitting device located in the second pixel PX2, and the third-color color filter layer 433 is disposed over the third pixel electrode 331 of the third light-emitting device located in the third pixel PX3. Accordingly, when viewed in the direction (z-axis direction) normal or perpendicular to the substrate 100 (e.g., when viewed in the plan view), the first-color color filter layer 413 overlaps the first pixel electrode 311, the second-color color filter layer 423 overlaps the second pixel electrode 321, and the third-color color filter layer 433 overlaps the third pixel electrode 331.

The capping layer 403 is disposed between the low refractive index layer 450 and the first-color through third-color color filter layers 413, 423, and 433. The capping layer 403 may be integrally formed to correspond to the first light-emitting device of the first pixel PX1, the second light-emitting device of the second pixel PX2, and the third light-emitting device of the third pixel PX3. The capping layer 403 may include (e.g., be) an inorganic material such as silicon oxide, silicon nitride, and/or silicon oxynitride.

A refractive index of the low refractive index layer 450 is lower than a refractive index of a layer under the low refractive index layer 450. In the display apparatus of FIG. 5, a refractive index of the low refractive index layer 450 is lower than a refractive index of each of the second-color quantum dot layer 425 and the third-color quantum dot layer 435 under the low refractive index layer 450. A refractive index of each of the second-color quantum dot layer 425 and the third-color quantum dot layer 435 may be about 1.7. A refractive index of the low refractive index layer 450 is lower than that of each of the second-color quantum dot layer 425 and the third-color quantum dot layer 435, and may range, for example, from about 1.1 to about 1.3. Because a refractive index of the low refractive index layer 450 is lower than a refractive index of a layer under the low refractive index layer 450, part of light traveling from the second-color quantum dot layer 425 and the third-color quantum dot layer 435 under the low refractive index layer 450 to the low refractive index layer 450 is totally reflected at an interface (e.g., an interface between the second-color quantum dot layer 425 and the low refractive index layer 450, and an interface between the third-color quantum dot layer 435 and the low refractive index layer 450) and travels again into the second-color quantum dot layer 425 and the third-color quantum dot layer 435.

In the second pixel PX2, the totally reflected light travels toward the second-color quantum dot layer 425. When the totally reflected light is light already converted by the second-color quantum dot layer 425 into light having a wavelength of about 495 nm to about 570 nm, the light is reflected at (e.g., on) the second pixel electrode 321 or at (e.g., on) the counter electrode 305 under the second-color quantum dot layer 425, passes through the low refractive index layer 450 again, and is emitted to the outside. When the totally reflected light is light that has a wavelength of about 450 nm to about 495 nm and passes through (e.g., and has already passed through) the second-color quantum dot layer 425 without being converted by the second-color quantum dot layer 425 into light having a wavelength of about 495 nm to about 570 nm, the totally reflected light may pass through the second-color quantum dot layer 425 again and may be converted by the second-color quantum dot layer 425 into light having a wavelength of about 495 nm to about 570 nm. Next, the light is reflected at (e.g., on) the second pixel electrode 321 or at (e.g., on) the counter electrode 305 under the second-color quantum dot layer 425, passes through the low refractive index layer 450 again, and is emitted to the outside.

In the third pixel PX3, the totally reflected light travels toward the third-color color quantum dot layer 435. When the totally reflected light is light already converted by the third-color quantum dot layer 435 into light having a wavelength of about 630 nm to about 780 nm, the light is reflected at (e.g., on) the third pixel electrode 331 or at (e.g., on) the counter electrode 305 under the third-color quantum dot layer 435, passes through the low refractive index layer 450 again, and is emitted to the outside. When the totally reflected light is light that has a wavelength of about 450 nm to about 495 nm and passes through (e.g., has already passed through) the third-color quantum dot layer 435 without being converted by the third-color quantum dot layer 435 into light having a wavelength of about 630 nm to about 780 nm, the totally reflected light may pass through the third-color quantum dot layer 435 again and may be converted by the third-color quantum dot layer 435 into light having a wavelength of about 630 nm to about 780 nm. Next, the light is reflected at (e.g., on) the third pixel electrode 331 or at (e.g., on) the counter electrode 305 under the third-color quantum dot layer 435, passes through the low refractive index layer 450 again, and is emitted to the outside.

In the display apparatus according to the present embodiment, because light generated by the second pixel PX2 or the third pixel PX3 is minimized or blocked from being emitted to the outside without being converted by the second-color quantum dot layer 425 or the third-color quantum dot layer 435, luminous efficiency may be significantly improved. To this end, as described above, the low refractive index layer 450 may have a refractive index lower than a refractive index of the capping layer 403 which ranges from about 1.4 to about 1.5. In some embodiments, the low refractive index layer 450 may have a refractive index lower than each of a refractive index of the second-color quantum dot layer 425 and a refractive index of the third-color quantum dot layer 435, each of which may be about 1.7. For example, a refractive index of the low refractive index layer 450 may range from about 1.1 to about 1.3. The low refractive index layer 450 includes the matrix part 451 and the plurality of particles 453 in the matrix part 451.

The matrix part 451 may include (e.g., be) a polymer material. The matrix part 451 may include (e.g., be) at least one selected from among an acrylic polymer, a silicon-based polymer, a urethane-based polymer, and an imide-based polymer. For example, the matrix part 451 may include (e.g., be) any one polymer material selected from among an acrylic polymer, a silicon-based polymer, a urethane-based polymer, and an imide-based polymer, or a combination of a plurality of selected polymer materials. Also, the matrix part 451 may include (e.g., be) at least one selected from among a siloxane polymer, a silsesquioxane polymer, an acrylic polymer substituted with a fluorine atom, a silicon-based polymer substituted with a fluorine atom, a urethane-based polymer substituted with a fluorine atom, and an imide-based polymer substituted with a fluorine atom. The matrix part 451 may be formed of siloxane, acryl, polyimide, urethane, and/or epoxy. The matrix part 451 may be formed by solidifying a polymer resin such as siloxane, acryl, polyimide, urethane, and/or epoxy in a high-temperature process or an ultraviolet treatment process.

The plurality of particles 453 in the matrix part 451 may be silica. A coating layer formed of an inorganic material may be on surfaces of the plurality of particles 453. The coating layer may include (e.g., be) silicon oxide and/or magnetite ($Fe_3O_4$). In some embodiments, the plurality of particles 453 may be hollow particles filled with air. When the plurality of particles 453 are hollow particles, the plurality of particles 453 may include (e.g., be) silicon oxide, acryl, polyimide, urethane, styrene, and/or epoxy. A refractive index of the plurality of particles 453 may be, for example, equal to or greater than 1.1 and equal to or less than 1.3. A refractive index of the low refractive index layer 450 may be equal to or greater than 1.1 and equal to or less than 1.3, by adjusting a refractive index of the low refractive index layer 450 by causing an average diameter of each of the plurality of particles 453 included in the low refractive index layer 450 to be equal to or greater than 20 nm and equal to or less than 150 nm.

The first portion P1 of the low refractive index layer 450 (e.g., the matrix part 451 of the first portion P1 of the low refractive index layer 450) close (e.g., close along the −Z-axis direction) to the first light-emitting device, the second light-emitting device, and the third light-emitting device includes fluorine. The fluorine is a hydrophobic material.

FIGS. 6 through 9 are cross-sectional views illustrating a process of manufacturing the display apparatus of FIG. 5.

Figure 6:
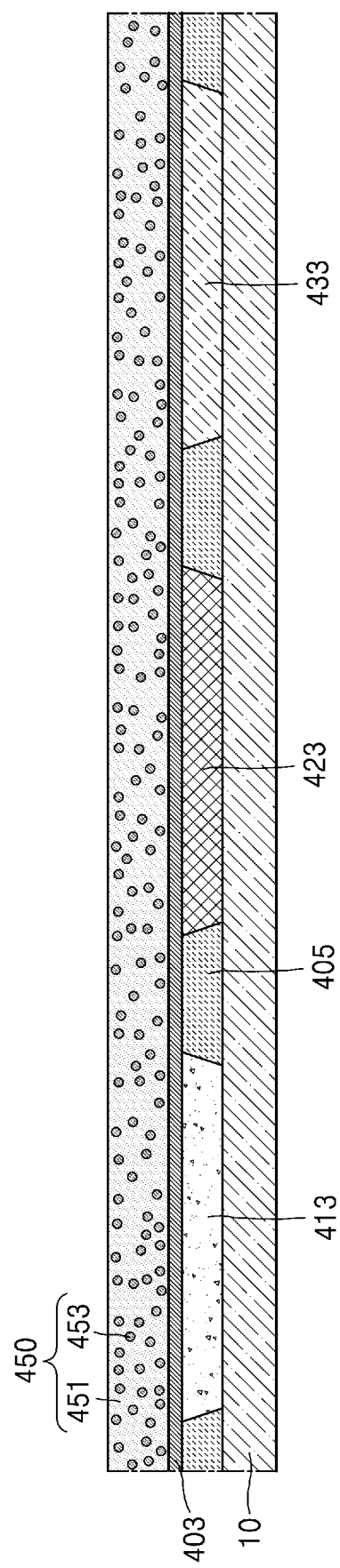
FIGS. 6 through 9 are each a cross-sectional view illustrating a process of manufacturing the display apparatus of FIG. 5, according to an embodiment.

As shown in FIG. 6, the black matrix 405 and/or the first-color through third-color color filter layers 413, 423, and 433 are formed on a carrier substrate 10 formed of glass and/or the like. The capping layer 403 is formed of silicon oxide, silicon nitride, and/or silicon oxynitride to cover the black matrix 405 and/or the first-color through third-color color filter layers 413, 423, and 433. After the capping layer 403 is formed, a material for forming the low refractive index layer 450 is applied to the capping layer 403. The material for forming the low refractive index layer 450 may contain 80 wt % of solvent and 20 wt % of solid content. Diethylene glycol ethyl methyl ether (MEDG) and/or propylene glycol methyl ether acetate (PGMEA) may be utilized as the solvent. 50 wt % of the solid content may be a resin, and the remaining 50 wt % of the solid content may be the plurality of particles 453 and a small amount of curing agent and/or dispersant. When the plurality of particles 453 is less than 40 wt % of the solid content, a refractive index of the low refractive index layer 450 may not be sufficiently lowered, and when the plurality of particles 453 is more than 70 wt % of the solid content, a bonding force with the matrix part 451 may be insufficient and/or dispersibility may be insufficient. Accordingly, the plurality of particles 453 may be equal to or greater than 40 wt % and equal to or less than 70 wt % of the solid content, and preferably may be about 50 wt %.

The material for forming the low refractive index layer 450 may not be directly utilized, and a material for forming the low refractive index layer 450 which is finally utilized may be prepared by adding fluorine to the material for forming the low refractive index layer 450. When the material for forming the low refractive index layer 450 in a liquid state is applied to (e.g., on) the capping layer 403, the plurality of particles 453 are substantially uniformly dispersed in the material for forming the low refractive index layer 450 as shown in FIG. 6.

Next, a thermal curing process is performed. First, prebaking may be performed at 100° C. for about 50 seconds to about 100 seconds. In this process, most of the solvent is removed. Also, the fluorine in the material for forming the low refractive index layer 450 moves in a direction away from the capping layer 403. The fluorine is hydrophobic and thus moves closer to air. For reference, as the fluorine moves closer to the air, the plurality of particles 453 move in a direction opposite to the direction in which the fluorine moves. After the pre-baking, main curing may be performed at 180° C. for about 30 minutes.

Figure 7:
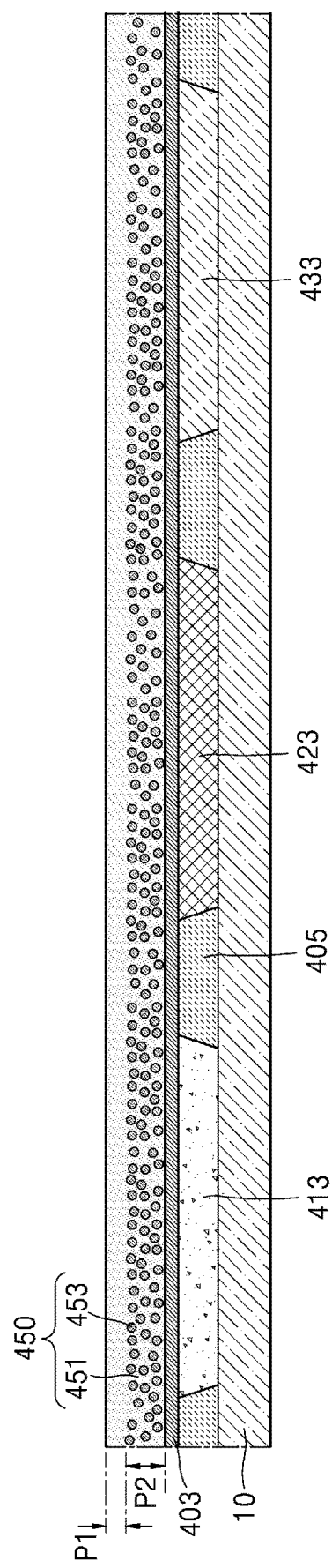
Figure 8:
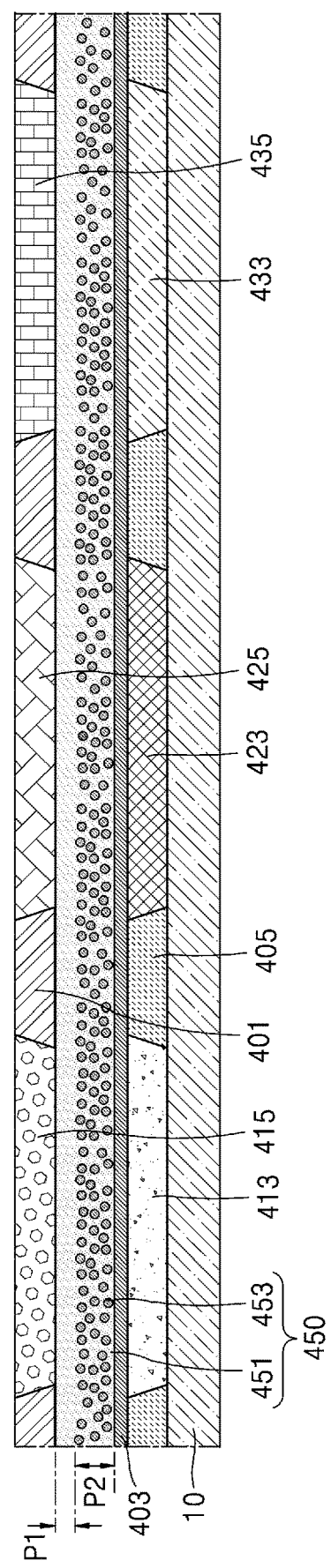

After this process, as shown in FIG. 7, the first portion P1 of the low refractive index layer 450 (e.g., the matrix part 451 of the first portion P1 of the low refractive index layer 450) far from the capping layer 403 includes the fluorine. Next, as shown in FIG. 8, the light-transmitting layer 415, the second-color quantum dot layer 425, and the third-color quantum dot layer 435 are formed on the low refractive index layer 450. Because a process of forming the light-transmitting layer 415, the second-color quantum dot layer 425, and the third-color quantum dot layer 435 utilizes a solution, it is useful (e.g., necessary) to minimize or block the solution from penetrating into the low refractive index layer 450. This is because, there is a void and/or the like that is an empty space in the matrix part 451 of the low refractive index layer 450, and when the solution penetrates into the low refractive index layer 450, the solution fills the void and/or the like, thereby increasing a refractive index of the low refractive index layer 450.

To this end, after the low refractive index layer 450 is formed, it may be considered that an additional capping layer is formed on a top surface of the low refractive index layer 450 by utilizing silicon oxide, silicon nitride, and/or silicon oxynitride. However, in this case, because a process of forming the additional capping layer has to be performed, a time taken to manufacture the display apparatus increases and a defect rate increases.

However, in the display apparatus according to the present embodiment, as shown in FIGS. 7 and 8, the first portion P1 of the low refractive index layer 450 (e.g., the matrix part 451 of the first portion P1 of the low refractive index layer 450) far from the capping layer 403 includes fluorine. The fluorine is a hydrophobic material. Accordingly, the first portion P1 of the low refractive index layer 450 is hydrophobic. Hence, even when a solution is utilized in a subsequent process after the low refractive index layer 450 is formed, the solution may be prevented or blocked from penetrating into the first portion P1 of the low refractive index layer 450, or the penetration of the solution into the first portion P1 of the low refractive index layer 450 may be reduced. Accordingly, a refractive index of the low refractive index layer 450 may be effectively prevented from increasing after the low refractive index layer 450 is formed, or an increase of the refractive index of the low refractive index layer 450 may be reduced or minimized. A thickness of the first portion P1 may range, for example, from about 10 nm to about 1000 nm.

When an organic material layer and an inorganic material layer contact each other, stress may occur at an interface and peeling and/or the like may occur between the organic material layer and the inorganic material layer. However, in the display apparatus according to the present embodiment, a capping layer that is an inorganic material layer is not added between the low refractive index layer 450 that is an organic material layer and the second-color and third-color quantum dot layers 425 and 435 that are organic material layers. Accordingly, peeling and/or the like due to stress at an interface may be effectively prevented or reduced.

Figure 9:
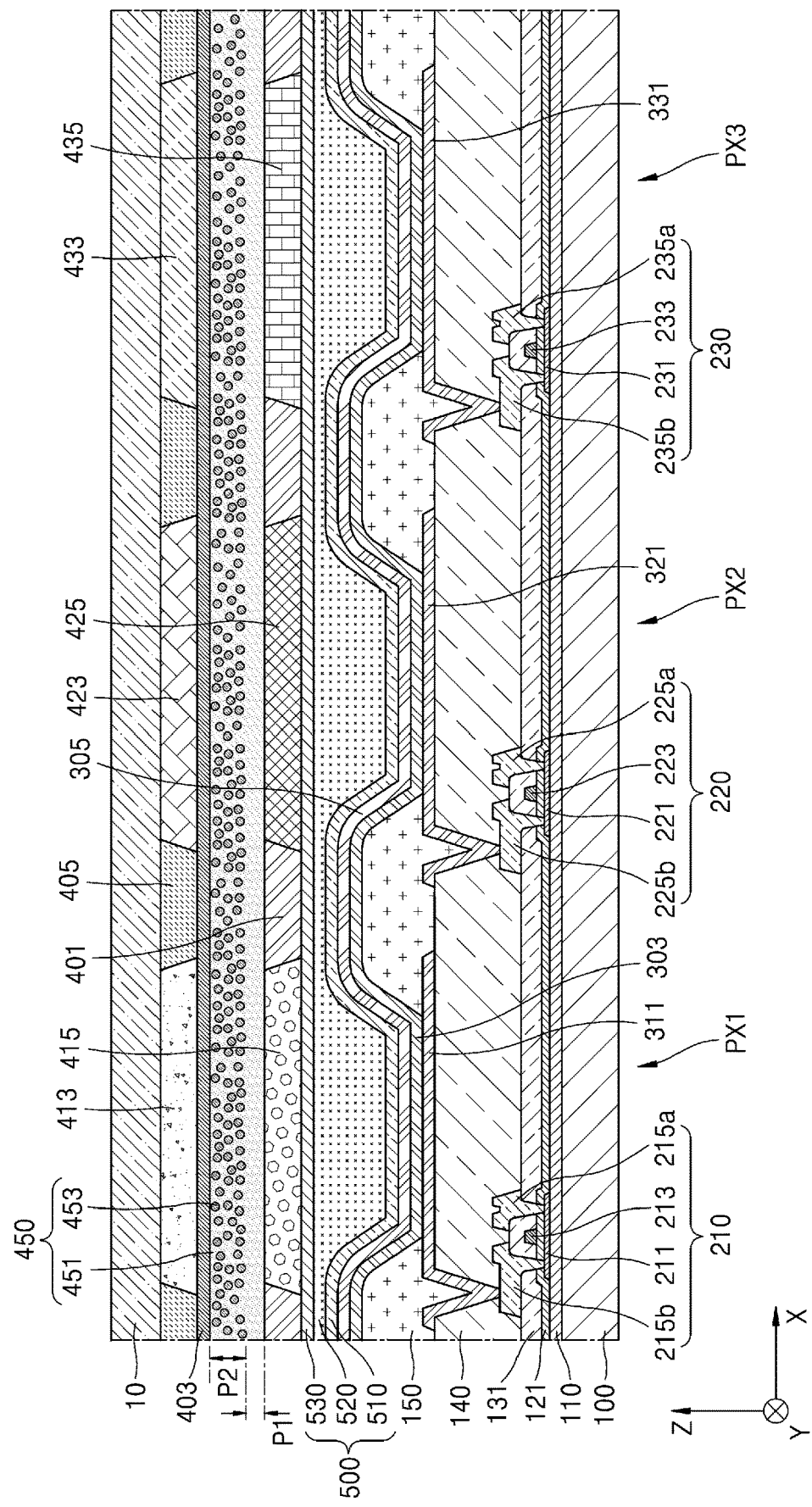

After the light-transmitting layer 415, the second-color quantum dot layer 425, and the third-color quantum dot layer 435 are formed on the low refractive index layer 450, the light-transmitting layer 415, the second-color quantum dot layer 425, and the third-color quantum dot layer 435 are disposed to face the encapsulation layer 500 as shown in FIG. 9. For example, the light-transmitting layer 415, the second-color quantum dot layer 425, and the third-color quantum dot layer 435 may be made to come into contact with the encapsulation layer 500 such that the carrier substrate 10 is an uppermost layer (e.g., in the +Z-axis direction, as shown in FIG. 9). When the carrier substrate 10 is removed, the display apparatus as shown in FIG. 5 may be manufactured. In order to easily remove the carrier substrate 10, various suitable modifications may be made. For example, a sacrificial layer may be disposed between the carrier substrate 10 and the first-color through third-color color filter layers 413, 423, and 433. The carrier substrate 10 may not be removed but may be utilized as an encapsulation substrate.

In the display apparatus according to the present embodiment, a fluorine content per unit volume in the first portion P1 of the low refractive index layer 450 (e.g., the matrix part 451 of the first portion P1 of the low refractive index layer 450) is greater than a fluorine content per unit volume in the second portion P2 of the low refractive index layer 450 (e.g., the matrix part 451 of the second portion P2 of the low refractive index layer 450) far from the first through third light-emitting devices. The first portion P1 may be above the first through third light-emitting devices and the second portion P2 may be above the first portion P1 such that the first portion P1 is between the first through third light-emitting devices and the second portion P2. In some embodiments, a fluorine content per unit volume in the first portion P1 of the low refractive index layer 450 (e.g., the matrix part 451 of the first portion P1 of the low refractive index layer 450) is greater than a fluorine content per unit volume in the second portion P2 (e.g., the matrix part 451 of the second portion P2 of the low refractive index layer 450)

farther from the first through third light-emitting devices than the first portion P1 of the low refractive index layer 450.

As described above, the fluorine in the material for forming the low-refractive-index layer 450 moves in the direction (−Z-axis direction of FIG. 5) away from the capping layer 403 in a process of forming the low-refractive-index layer 450. Hence, the closer to the first through third light-emitting devices, the greater a fluorine content per unit volume in the matrix part 451. For example, the fluorine content per unit volume in the matrix part 451 may increase as it goes from a portion of the matrix part 451 away from the first through third light-emitting devices toward the first through third light-emitting devices (e.g., in −Z-axis direction shown in FIG. 5). For example, the fluorine content per unit volume may increase in the matrix part 451 along a direction toward the first through third light-emitting devices. For example, the fluorine content per unit volume in the matrix part 451 may increase (e.g., linearly or non-linearly) along the −Z-axis direction, for example, from an upper surface of the low refractive index layer 450 to a bottom surface of the low refractive index layer 450, as shown in FIGS. 5 and 9. In some embodiments, the fluorine content per unit volume in the matrix part 451 increases with decreasing distance away from the first through third light-emitting devices.

As the fluorine moves closer to the air in a thermal curing process as described above, the plurality of particles 453 move in a direction (+Z-axis direction of FIG. 5) opposite to the direction in which the fluorine moves. Hence, the number of the plurality of particles 453 per unit volume in the first portion P1 of the low refractive index layer 450 close (e.g., close along the −Z-axis direction as in FIG. 5) to the first through third light-emitting devices is less than the number of the plurality of particles 453 per unit volume in the second portion P2 of the low refractive index layer 450 far (e.g., far along the +Z-axis direction as in FIG. 5) from the first through third light-emitting devices. For example, the number of the plurality of particles 453 per unit volume in the first portion P1 of the low refractive index layer 450 close (e.g., close along the −Z-axis direction as in FIG. 5) to the first through third light-emitting devices is less than the number of the plurality of particles 453 per unit volume in the second portion P2 farther from the first through third light-emitting devices than the first portion P1 of the low refractive index layer 450 is to the first through third light-emitting devices.

For reference, as shown in FIGS. 6 through 8, the first-color through third-color color filter layers 413, 423, and 433, the black matrix 405, the light-transmitting layer 415, the second-color color filter layer 425, the third-color color filter layer 435, and the barrier layer 401 are formed on the carrier substrate 10. For example, the barrier layer 401 is formed by forming a layer on the carrier substrate 10 and forming through-holes in the layer. In this case, in a process of forming the through-holes, an upper portion of the layer in which the through-holes are formed is etched more than a lower portion close to the carrier substrate 10. For example, as illustrated in FIGS. 6-8, a through-hole in the barrier layer 401 may have a width and/or planar area at an upper surface that is respectively greater than a width and/or planar area at a lower surface. Accordingly, the area of a surface of the barrier layer 401 close to the carrier substrate 10 is greater than the area of a surface of the barrier layer 401 far from the carrier substrate 10. For example, as illustrated in FIGS. 6-8, a planar area of the lower surface of the barrier layer 401 may be greater than a planar area of the upper surface of the barrier layer 401. Accordingly, in the display apparatus of FIG. 5, the area of a surface of the barrier layer 401 close (e.g., close along the −Z-axis direction) to the substrate 100 may be less than the area of a surface of the barrier layer 401 far (e.g., far along the +Z-axis direction) from the substrate 100. For example, as illustrated in FIGS. 5 and 9, the planar area of the upper surface of the barrier layer 401 may be greater than the planar area of the lower surface of the barrier layer 401.

However, in the display apparatus of FIG. 1, because the barrier layer 401 is formed on the encapsulation layer 500, the area of a surface of the barrier layer 401 close (e.g., close along the −Z-axis direction) to the substrate 100 may be greater than the area of a surface of the barrier layer 401 far (e.g., far along the +Z-axis direction) from the substrate 100. For example, a planar area of a lower surface of the barrier layer 401 may be greater than a planar area of the upper surface of the barrier layer 401. For this reason, the display apparatus of FIG. 5 and the display apparatus of FIG. 1 may be different from each other in inclined directions of inner surfaces of through-holes of the barrier layer 401 or inner surfaces of through-holes of the black matrix 405. For example, as illustrated in the embodiment of FIG. 1, a normal or perpendicular direction of a side surface of the barrier layer 401 that forms part of a through-hole may have a Z-axis component in the +Z-axis direction. Also, as illustrated in the embodiment of FIG. 5, a normal direction of a side surface of the barrier layer 401 that forms part of a through-hole may have a Z-axis component in the −Z-axis direction.

Figure 10:
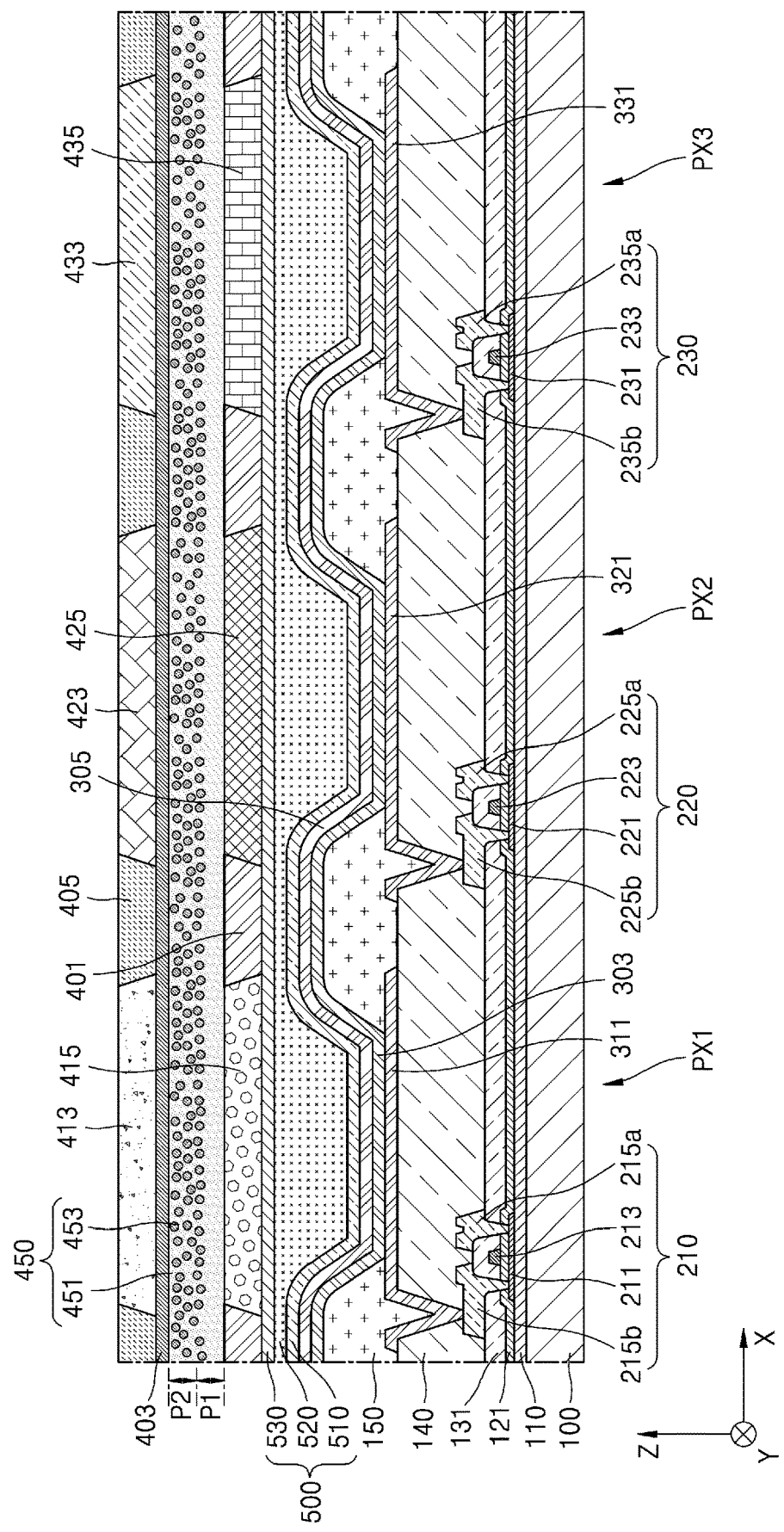
FIG. 10 is a cross-sectional view illustrating a portion of a display apparatus according to another embodiment.

In FIG. 5, the particles 453 hardly exist in the first portion P1 of the low refractive index layer 450 close (e.g., close along the −Z-axis direction) to the first through third light-emitting devices. However, as shown in FIG. 10, which is a cross-sectional view illustrating a portion of a display apparatus according to another embodiment, some of the particles 453 may be included in the first portion P1 of the low refractive index layer 450. This is because, as the amount of fluorine added to the material for forming the low refractive index layer 450 increases to form the low refractive index layer 450, a thickness of the first portion P1 including the fluorine may increase.

Figure 11:
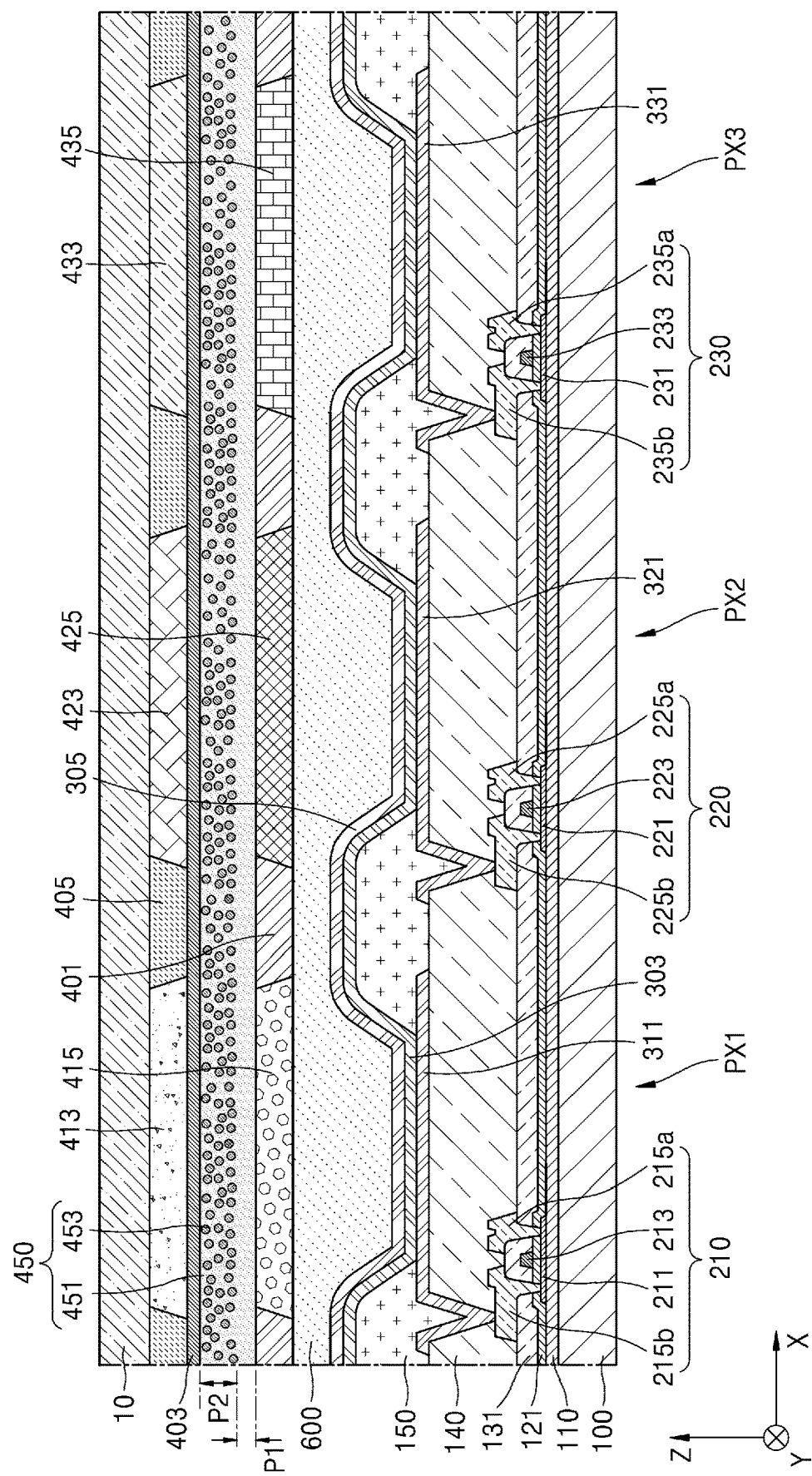
FIG. 11 is a cross-sectional view illustrating a portion of a display apparatus according to another embodiment.

When the carrier substrate 10 is not removed and is utilized as an encapsulation substrate, the encapsulation layer 500 may not be required. Accordingly, as shown in FIG. 11, which is a cross-sectional view illustrating a portion of a display apparatus according to another embodiment, an encapsulation layer may not be disposed but a filler 600 may be disposed between the counter electrode 305 and the light-transmitting layer 415, the second-color quantum dot layer 425, and the third-color quantum dot layer 435. Any of various suitable polymer resins may be utilized as the filler 600. For example, polyvinyl alcohol, polyvinylpyrrolidone, polyester, polyolefin, methyl methacrylate, polycarbonate, acrylonitrile, cellulose acetate, epoxy, and/or polyurethane may be utilized.

In the above embodiments, the matrix part 451 is integrally formed from a bottom surface of the low refractive index layer 450 close (e.g., close along the −Z-axis direction) to the first through third light-emitting devices to a top surface of the low refractive index layer 450 far (e.g., far along the +Z-axis direction) from the first through third light-emitting devices. For example, the bottom surface of the low refractive index layer 450 may face the first through third light-emitting devices, and the top surface of the low refractive index layer 450 may face oppositely away from the first through third light-emitting devices. For example, there may be no interface between the first portion P1 and the second portion P2. This is because the first portion P1 and the second portion P2 are not formed through separate processes.

According to the one or more embodiments, a display apparatus having high luminous efficiency and a simplified structure may be provided. However, the present disclosure is not limited by such an aspect.

It should be understood that embodiments described herein should be considered in a descriptive sense only and not for purposes of limitation. Descriptions of features and/or aspects within each embodiment should typically be considered as available for other similar features and/or aspects, respectively, in other embodiments. While one or more embodiments have been described with reference to the drawings, it will be understood by one of ordinary skill in the art that various suitable changes in form and details may be made therein without departing from the spirit and scope as defined by the following claims and equivalents thereof.

What is claimed is:

1. A display apparatus comprising:
   a substrate;
   a first light-emitting device, a second light-emitting device, and a third light-emitting device, each comprising a first-color emission layer and being over the substrate;
   a second-color quantum dot layer over the second light-emitting device;
   a third-color quantum dot layer over the third light-emitting device;
   a low refractive index layer over the second-color quantum dot layer and the third-color quantum dot layer to correspond to the first through third light-emitting devices, and comprising a matrix part and a plurality of particles in the matrix part, wherein the matrix part comprises a first portion away from the first through third light-emitting devices and comprising fluorine, and a second portion between the first through third light-emitting devices and the first portion of the matrix part, and wherein the first and second portions of the matrix part form an integral body;
   a first-color color filter layer over the low refractive index layer to correspond to the first light-emitting device;
   a second-color color filter layer over the low refractive index layer to correspond to the second light-emitting device; and
   a third-color color filter layer over the low refractive index layer to correspond to the third light-emitting device.

2. The display apparatus of claim 1, further comprising a light-transmitting layer over the first light-emitting device, wherein the low refractive index layer is over the light-transmitting layer.

3. The display apparatus of claim 1, wherein the first portion of the matrix part is greater in fluorine content per unit volume than in the second portion of the matrix part.

4. The display apparatus of claim 1, wherein the farther away from the first through third light-emitting devices, the greater a fluorine content per unit volume in the matrix part is.

5. The display apparatus of claim 1, wherein the second portion of the matrix part does not comprise fluorine.

6. The display apparatus of claim 1, wherein a first portion of the low refractive index layer away from the first through third light-emitting devices is less in number of the plurality of particles per unit volume than in a second portion of the low refractive index layer closer to the first through third light-emitting devices than the first portion of the low refractive index layer is to the first through third light-emitting devices.

7. The display apparatus of claim 1, wherein a first portion of the low refractive index layer away from the first through third light-emitting devices does not comprise the plurality of particles.

8. The display apparatus of claim 1, further comprising a capping layer between the low refractive index layer and the second-color and third-color quantum dot layers to correspond to the first through third light-emitting devices.

9. The display apparatus of claim 1, wherein the matrix part is integrally formed as a single body from a bottom surface of the low refractive index layer close to the first through third light-emitting devices to a top surface of the low refractive index layer away from the first through third light-emitting devices.

10. The display apparatus of claim 1, wherein fluorine content per unit volume in the matrix part increases from a bottom surface of the low refractive index layer close to the first through third light-emitting devices to a top surface of the low refractive index layer away from the first through third light-emitting devices.

* * * * *